(12) United States Patent
Yamazaki et al.

(10) Patent No.: US 8,278,135 B2
(45) Date of Patent: Oct. 2, 2012

(54) HIGHLY PURE FILM FORMATION METHOD FOR LIGHT EMITTING DEVICE USING GAS FROM EVAPORATED ELECTROLUMINESCENT SOURCE

(75) Inventors: Shunpei Yamazaki, Tokyo (JP); Toshimitsu Konuma, Kanagawa (JP); Takeshi Nishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/856,774

(22) Filed: Sep. 18, 2007

(65) Prior Publication Data

US 2008/0014822 A1 Jan. 17, 2008

Related U.S. Application Data

(60) Continuation of application No. 10/854,730, filed on May 27, 2004, now Pat. No. 7,482,631, and a division of application No. 10/033,100, filed on Oct. 25, 2001, now Pat. No. 6,770,562.

(30) Foreign Application Priority Data

Oct. 26, 2000 (JP) .................. 2000-326278

(51) Int. Cl.
*H01J 9/233* (2006.01)
(52) U.S. Cl. .......... 438/99; 438/507; 438/509; 438/908; 445/24; 257/E21.242; 257/E21.299
(58) Field of Classification Search .............. 445/24; 438/99, 507, 509, 908; 257/E21.242, E21.299
See application file for complete search history.

(56) References Cited

U.S. PATENT DOCUMENTS

| 4,611,385 | A | | 9/1986 | Forrest |
| 5,304,406 | A | | 4/1994 | Hongo |
| 5,330,633 | A | | 7/1994 | Matsumoto |
| 5,377,429 | A | | 1/1995 | Sandhu |
| 5,512,320 | A | | 4/1996 | Turner |
| 5,542,979 | A | * | 8/1996 | Matsuno et al. ............. 118/719 |
| 5,545,443 | A | | 8/1996 | Yamada |
| 5,817,366 | A | * | 10/1998 | Arai et al. ..................... 427/66 |
| 5,897,710 | A | | 4/1999 | Sato |
| 6,004,047 | A | | 12/1999 | Akimoto |
| 6,160,143 | A | | 12/2000 | Alasti |
| 6,420,200 | B1 | | 7/2002 | Yamazaki |
| 6,583,583 | B1 | | 6/2003 | Soeda |
| 6,770,562 | B2 | | 8/2004 | Yamazaki et al. |
| 6,776,847 | B2 | | 8/2004 | Yamazaki |
| 6,861,614 | B1 | | 3/2005 | Tanabe et al. |
| 7,482,631 | B2 | | 1/2009 | Yamazaki et al. |
| 2002/0062790 | A1 | | 5/2002 | Ikeda |
| 2003/0026601 | A1 | | 2/2003 | Jabbour |
| 2005/0106322 | A1 | | 5/2005 | Yamazaki |

FOREIGN PATENT DOCUMENTS

JP 9-054438 2/1997

(Continued)

*Primary Examiner* — Hsien Ming Lee
*Assistant Examiner* — Walter H Swanson
(74) *Attorney, Agent, or Firm* — Fish & Richardson P.C.

(57) ABSTRACT

There is provided a film formation apparatus which is capable of forming an EL layer using an EL material with high purity. The EL material is purified by sublimation immediately before film formation in the film formation apparatus, to thereby remove oxygen, water, and another impurity, which are included in the EL material. Also, when film formation is performed using the EL material (high purity EL material) obtained by purifying with sublimation as an evaporation source, a high purity EL layer can be formed.

12 Claims, 11 Drawing Sheets

FOREIGN PATENT DOCUMENTS

| | | |
|---|---|---|
| JP | 09-256142 A | 9/1997 |
| JP | 10-092800 | 4/1998 |
| JP | 10-204622 | 8/1998 |
| JP | 2000-093701 | 4/2000 |
| JP | 2000-223269 | 8/2000 |
| JP | 2000223269 A | 8/2000 |
| JP | 2000-252061 A | 9/2000 |
| JP | 4054561 A | 2/2008 |

* cited by examiner

HIGHLY PURE FILM FORMATION METHOD FOR LIGHT EMITTING DEVICE USING GAS FROM EVAPORATED ELECTROLUMINESCENT SOURCE

BACKGROUND OF THE INVENTION

1. Field of the Invention

The present invention relates to a film formation apparatus and a film formation method, which are used when a film formation material is purified by sublimation to form a film using the purified material in forming an EL element over a substrate.

2. Description of the Related Art

In recent years, there has been an active study of a light emitting device which has an EL element as a self light emitting element, and in particular, a light emitting device using an organic material as an EL material has attracted attention. This light emitting device is also called an organic EL display (OELD) or an organic light emitting diode (OLED).

Note that the EL element has a layer containing an organic compound in which electro luminescence is generated by applying electric field (hereinafter referred to as EL layer), an anode, and a cathode. The electro luminescence in the organic compound includes luminescence produced in returning from a singlet excitation state to a ground state (fluorescence) and luminescence produced in returning from a triplet excitation state to a ground state (phosphorescence). A light emitting device manufactured by a film formation apparatus and a film formation method according to the present invention can be applied to the case where either luminescence is used.

A light emitting device has a characteristic that a problem with respect to an angle of a field of view is not caused because it is a self light emitting type which is different from a liquid crystal display device. That is, it is more suitable than the liquid crystal display device when a display is used in the outdoors, and thus various ways of use are proposed.

The EL element has a structure in which an EL layer is interposed between a pair of electrodes. The EL layer generally has a laminate structure. Typically, there is a laminate structure called "hole transport layer/light emitting layer/electron transport layer", which is proposed by Tang, et al. of Eastman Kodak Company. Light emitting efficiency is very high in this structure, and thus, this structure is adapted to most of the light emitting devices which have been researched and developed at present.

In addition, a structure in which a hole injection layer, a hole transport layer, a light emitting layer, and an electron transport layer are laminated in this order on the anode is preferable. Also, a structure in which a hole injection layer, a hole transport layer, a light emitting layer, an electron transport layer, and an electron injection layer are laminated in this order on the anode is preferable. The light emitting layer may be doped with a fluorescent pigment or the like. These layers may be formed using a low molecular system material or a polymer system material.

Note that all layers provided between the cathode and the anode in this specification is generically called the EL layer. Thus, the hole injection layer, the hole transport layer, the light emitting layer, the electron transport layer, and the electron injection layer, which are described above, are all included in the EL layer.

Also, in this specification, a light emitting element formed of a cathode, an EL layer, and an anode is called the EL element. There are two types, that is, a type in which an EL layer is formed between two kinds of stripe-shaped electrodes provided to intersect each other (simple matrix type) and a type in which an EL layer is formed between a pixel electrode which is connected with a TFT and arranged in matrix and a counter electrode (active matrix type).

The most serious problem in putting the EL element to practical use is the insufficiency of the element life. Also, deterioration of the element is recognized in the form that a non light emitting region (dark spot) is expanded with light emission for a long period of time due to deterioration of the EL layer which eventually becomes a problem.

An EL material for forming the EL layer is deteriorated by an impurity such as oxygen, water, or the like. Also, when other impurity is included in the EL material, there arises a fear that the deterioration of the EL layer is adversely influenced.

Conventionally, when film formation is performed by an evaporation method, an evaporated material is used without being processed. However, it is considered that an impurity is mixed into the evaporated material at evaporation. That is, there is a possibility that oxygen, water, and other impurity are mixed as one reason for the deterioration of the EL element.

Also, when the evaporated material has been purified in advance, the purity can be increased. However, there is a possibility that an impurity is mixed during a period until the evaporation is completed.

SUMMARY OF THE INVENTION

The present invention has been made in view of the above problems, and an object of the present invention is therefore to provide a film formation apparatus with which an impurity included in an EL material at film formation is separated and removed, film formation is performed using an EL material with the increased purity, and thus an EL layer with high purity can be formed. Also, another object of the present invention is to provide a film formation method using the film formation apparatus of the present invention.

The present invention is characterized in that the EL material is purified by sublimation using a sublimation temperature of the pure EL material immediately before the film formation to remove plural impurities included in the EL material, and then a thin film is formed using the purified EL material (hereinafter referred to as high purity EL material) as an evaporation source.

In FIG. 1, it will be described that in the case where the EL material in which plural impurity substances are included is evaporated from a solid and a temperature is changed, plural substances can be separated from the EL material in accordance with different sublimation temperatures of respective substances. Note that an ordinate is given by a temperature and an abscissa is given by the total amount of precipitation. In this specification, a substance (impurity) which has a higher sublimation temperature than the high purity EL material is called a high temperature material, and a substance (impurity) which has a lower sublimation temperature is called a low temperature material. Also, the high purity EL material which is sublimated at a middle temperature located between a high temperature and a low temperature is called a middle temperature material. Note that, with examining a material precipitated at every temperature in advance by an analysis such as a mass analysis (GC-MS), a sublimation temperature of the pure EL material can be examined.

First, a temperature at which all substances (high purity EL material and impurity) included in the EL material are evaporated (hereinafter referred to as complete sublimation temperature) is set. Thus, there are all substances included in the EL material as gases in a complete sublimation region 100.

Thereafter, when a temperature is gradually decreased, a high temperature material which has a high sublimation temperature is precipitated as a solid in a high temperature material precipitation region 101 shown in FIG. 1.

Further, when a temperature is decreased, a middle temperature material (high purity EL material) as a main product is precipitated in a middle temperature material precipitation region 102 shown in FIG. 1. Then, a temperature is again decreased, a low temperature material is precipitated in a low temperature material precipitation region 103.

That is, according to the present invention, there are provided a film formation apparatus and a film formation method for separating an impurity precipitated at a high temperature (high temperature material) or an impurity precipitated at a low temperature (low temperature material) from the high purity EL material (middle temperature material) based on a precipitation temperature difference and performing film formation using only the high purity EL material. Further, it is characterized in that not only a film formation material but also a film formation apparatus itself has various functions for obtaining high purity.

In FIGS. 2A and 2B, a method of performing film formation by evaporation after an EL material 200 is purified by sublimation will be described. FIGS. 2A and 2B show cross sectional views. First, as shown in FIG. 2A, separation of a low temperature material (impurity) is performed. A system has a temperature control mechanism. In the system, with respect to the EL material, a change in a state between a solid and a gas due to a temperature, that is, a phenomenon called sublimation is occurring. In a plurality of systems shown in FIGS. 2A and 2B, the change in the state is produced. The temperature control mechanism includes a heater as a concrete example. A system (1) 201 includes the EL material 200. Also, the system (1) 201 has a temperature control mechanism (a) 203 and thus a temperature can be controlled to a complete sublimation temperature for evaporating all the EL material. The EL material evaporated in such a system (1) 201 is called a gas EL material.

The gas EL material generated in the system (1) 201 is moved to a provided system (2) 204 as shown in FIG. 2A. The system (2) 204 has a temperature control mechanism (b) 205 which is capable of keeping the system (2) 204 at a middle temperature. Note that in the cross sectional view shown in FIG. 2A, a lower side of the system (2) 204 is coupled to the system (1) 201 so that all the gases produced in the system (1) 201 can be moved to the system (2) 204. Also, in an upper side portion, an opening 210 is provided so that the gases in the system (2) 204 can be passed therethrough.

Of the gas EL material moved to the system (2) 204, a substance sublimated at a middle temperature or higher is precipitated as a solid in a precipitation region (a) 211 inside the system (2) 204. In the specification of the present invention, the substance precipitated here is called a semi EL material. Note that a low temperature material sublimated at a middle temperature or lower is left as a gas and thus emitted from the opening 210 of the system (2) 204 to the outer portion thereof. The low temperature material emitted here is an impurity included in the EL material and thus recovered to the outside.

Next, the system (2) 204 in which the gases are removed is inversed by 180° as shown in FIG. 2B. Then, the system (2) 204 is kept at a complete sublimation temperature by the temperature control mechanism (b) 205. Thus, the semi EL material precipitated inside the system (2) 204 is evaporated and moved to a system (3) 206.

The system (3) 206 has a temperature control mechanism (c) 207. Here, the system (3) 206 is kept at a high temperature by the temperature control mechanism (c) 207. At this time, of the semi EL material, a high temperature material (impurity) is precipitated in a region (b) 212 inside the system (3) 206. Thus, the high temperature material (impurity) can be separated and there can be only a middle temperature material (high purity EL material) as a gas inside the system (3) 206.

Also, as in the case of the system (2) 204 shown in FIG. 2A, the system (3) 206 has an opening 213 in its upper portion so that a gas can be passed therethrough. Thus, the high purity EL material (gas) can be emitted to the outside of the system (3) 206.

Then, a substrate 208 is provided in a direction along which the high purity EL material (gas) is emitted, and the high purity EL material obtained by purification with sublimation so far can be formed to be a film (evaporated).

Note that it is preferable that the substrate 208 is thermally treated immediately before film formation to remove an impurity such as oxygen or water on the substrate 208.

Further, as a material used for inside of a film formation chamber for performing purification of the EL material with sublimation and film formation, aluminum, stainless steel (SUS), or the like, which is electrolytic-polished to a mirror state, is used for the internal wall surface. This is because absorbability of the impurity such as oxygen or water can be reduced by decreasing its surface area. Thus, a degree of vacuum in the film formation chamber can be kept to be $10^{-5}$ to $10^{-6}$ Pa. Also, materials such as ceramics processed in order that the number of pores is minimized are used for the inner member. Note that these preferably have surface smoothness of which average roughness in the center line is 30 angstroms or less.

Also, when gases are introduced into respective processing chambers such as a film formation chamber and a transfer chamber, which are included in the film formation apparatus of the present invention, the impurity such as oxygen or water is removed by a gas purifying unit located immediately in front of the respective processing chambers, thereby introducing high purified gases thereinto.

Further, a magnetic levitation turbo molecular pump, a cryopump, or a dry pump is provided in each of all the processing chambers such as the film formation chamber and the transfer chamber, which are included in the film formation apparatus of the present invention. Thus, a degree of vacuum to be reached in the respective processing chambers can be set to be $10^{-5}$ to $10^{-6}$ Pa and back diffusion of the impurity from a pump side and an evacuation system can be controlled.

Note that, when an EL layer is formed by using the film formation apparatus of the present invention, surface processing of an anode or a cathode of an EL element which is formed on a substrate, is performed before forming the EL layer. As its concrete method, there is a method of performing thermal treatment with irradiating ultraviolet light in an oxygen atmosphere, a method of performing thermal treatment with conducting oxygen plasma processing or hydrogen plasma processing, or the like. Note that a heating temperature is preferably 100° C. or lower. Also, it is effective that a mechanism for heating the film formation chamber at 100° C. or lower is provided in the film formation chamber in order to remove the impurity in the film formation chamber before film formation.

Note that the purification with sublimation in the present invention can be applied to purification of not only the EL material but also of other material such as a metal material used for evacuation.

DESCRIPTION OF THE PREFERRED EMBODIMENTS

Figure 1:
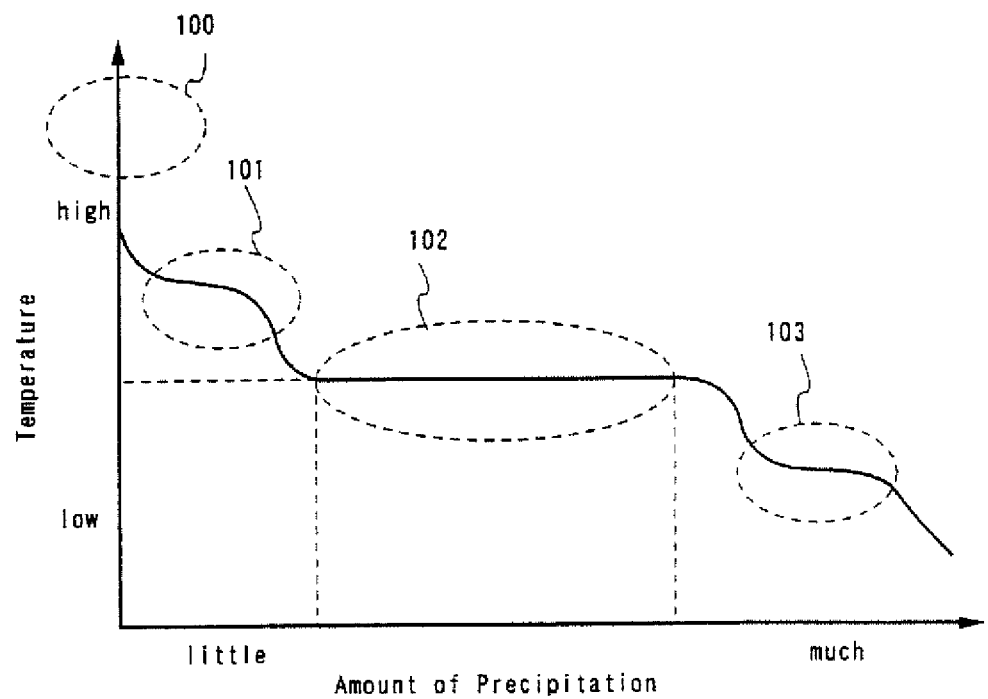
FIG. 1 is a diagram showing an amount of EL material precipitation as a function of temperature.
Figure 2B:
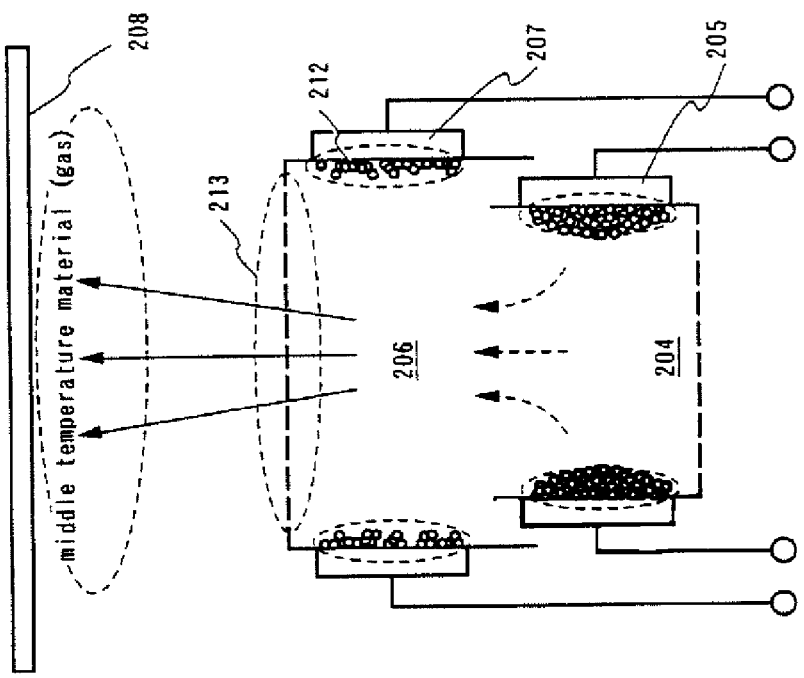
FIGS. 2A and 2B are diagrams showing a structure of the present invention.
Figure 2A:
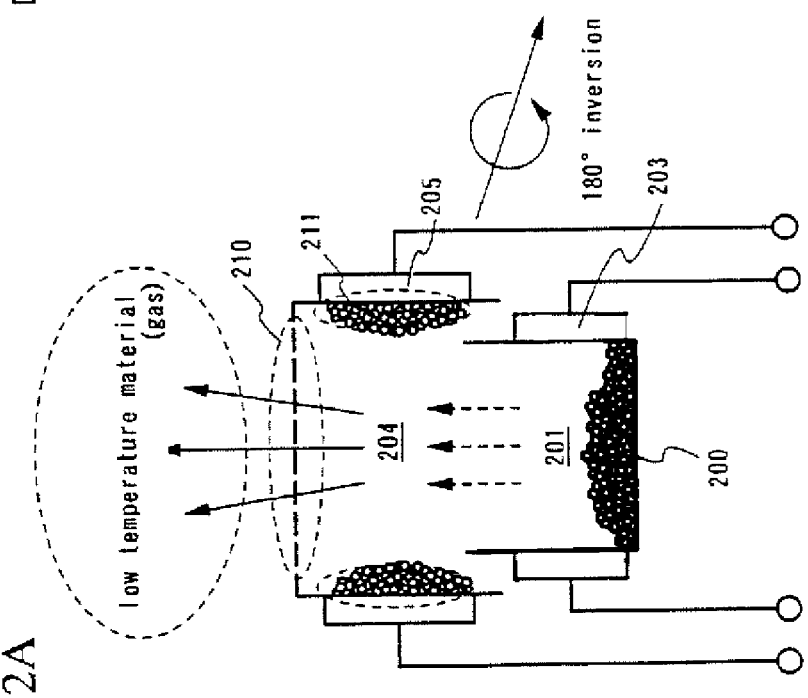
Figure 3A:
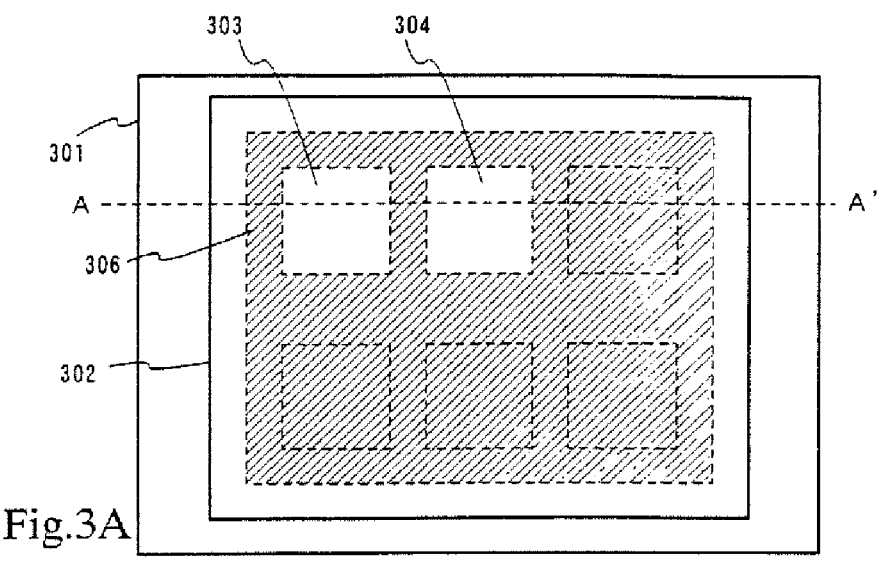
FIGS. 3A to 3C are diagrams showing structures of a film formation chamber.
Figure 3B:
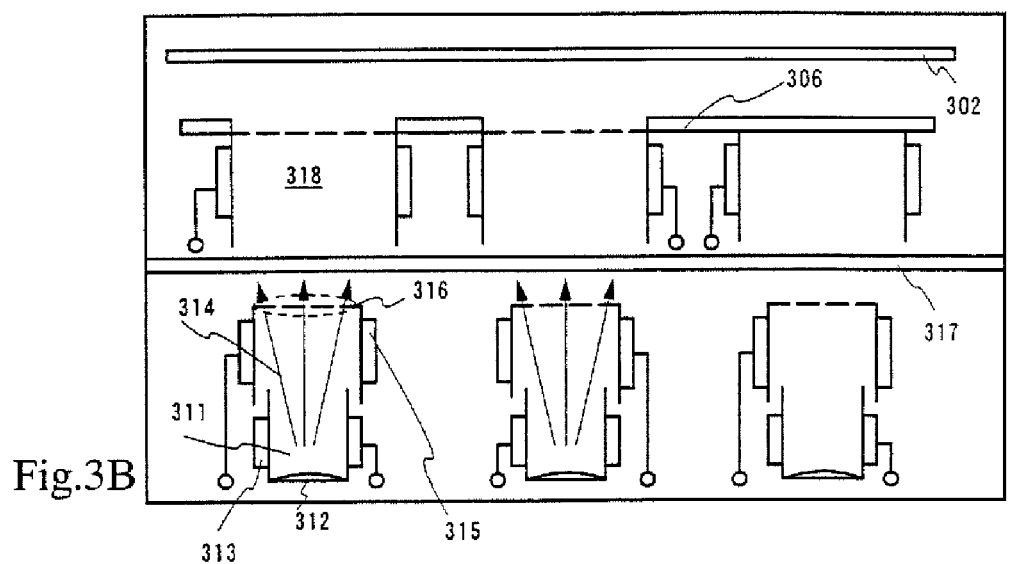
Figure 3C:
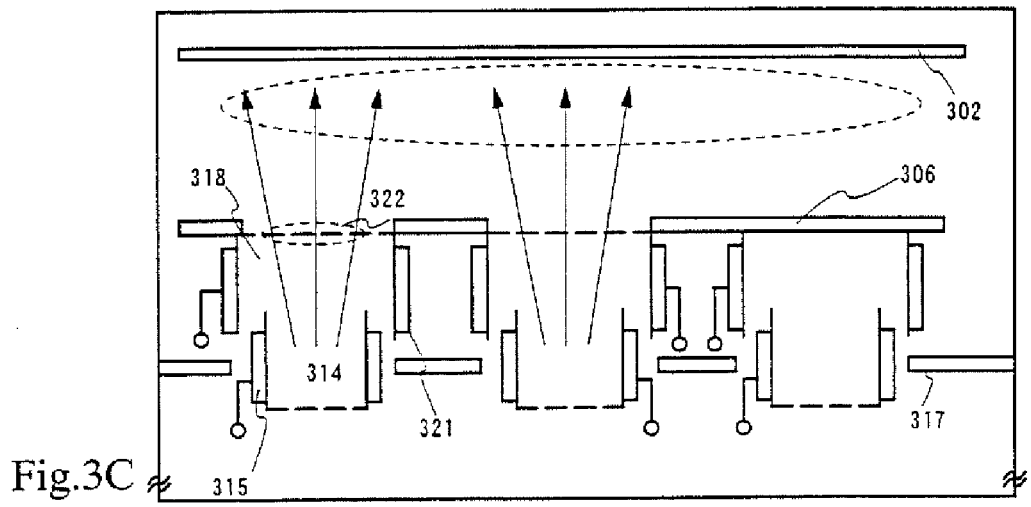

FIGS. 3A to 3C show a structure of a film formation chamber provided in a film formation apparatus of the present invention. FIG. 3A is a top view of the film formation chamber and FIGS. 3B and 3C are cross sectional views thereof. Note that identical reference numerals are used for the same portions.

In FIG. 3A, reference numeral 301 denotes a film formation chamber. A substrate 302 is transferred to the inner portion of the film formation chamber 301. When the substrate 302 is transferred therein, a shutter (2) 306 is opened in order that only a necessary evaporation source is used from among a plurality of evaporation sources provided in the film formation chamber 301. Note that the shutter (2) 306 is located between the evaporation sources and the substrate 302. Also, in order to perform evaporation onto the substrate from only a desired evaporation source, the shutter (2) 306 has a function of blocking emission of evaporated materials emitted from the other evaporation sources. FIGS. 3A to 3C show the case in which coevaporation is performed using evaporation sources (1) 303 and (2) 304 of the plurality of evaporation sources.

The concrete structure will be described using FIGS. 3B and 3C showing cross sectional structures obtained by cutting FIG. 3A along a dot line A-A' in a vertical direction to a paper surface.

First, in FIG. 3B, a low temperature material of impurities included in an EL material before the evaporation is separated and removed. A system (1) 311 is provided with an EL material 312. Also, the system (1) 311 has a temperature control mechanism (1) 313 and thus a temperature inside the system (1) 311 can be controlled.

The inner portion of the system (1) 311 is kept at a temperature (complete sublimation temperature) at which the EL material is evaporated to become a gas EL material by the temperature control mechanism (1) 313. Then, the gas EL material is moved from the system (1) 311 to a system (2) 314.

The system (2) 314 is provided with a temperature control mechanism (2) 315, and thus a temperature inside the system (2) 314 can be controlled.

The system (2) 314 is kept at a temperature (middle temperature) so that an EL material including a middle temperature material and a high temperature material is precipitated as a solid from among the gas EL material inside the system (2) 314. At this time, the low temperature material is left as a gas and emitted from an opening 316 of the system (2) 314 to the outer portion thereof. Note that, at this time, in the inner portion of the film formation chamber, the systems (1) 311 and (2) 314 are isolated from a system (3) 318 located in the above portion by a shutter (1) 317.

Also, although not shown here, the low temperature material (gas) emitted from the opening 316 of the system (2) 314 is emitted to the outer portion of the apparatus by an evacuation system. Note that the evacuation here is performed by a cryopump.

When the low temperature material is removed, the shutter (1) 317 is opened and the system (2) 314 is inverted by 180° as shown in FIG. 3C. Then, the system (2) 314 is coupled to the system (3) 318.

In the system (2) 314, there is the EL material including the middle temperature material and the high temperature material which are precipitated in FIG. 3B. When the inner portion of the system (2) 314 is made at a complete sublimation temperature by the temperature control mechanism (2) 315, the EL material can be evaporated again. Then, the evaporated EL material is moved from the system (2) 314 to the system (3) 318. The system (3) 318 has a temperature control mechanism (3) 321. The inner portion of the system (3) 318 is kept at a high temperature by the temperature control mechanism (3) 321. At this time, the high temperature material included in the evaporated EL material is sublimated and precipitated inside the system (3) 318. In the above procedure, a gas in the system (3) 318 is only the high purity EL material (middle temperature material).

Further, the shutter (2) 306 is provided in the upper portions of the systems (3) 318 included in the respective evaporation sources, and thus only the shutter for a necessary evaporation source is opened. Note that only shutters for the evaporation sources (1) 303 and (2) 304 are opened in this embodiment.

That is, when the shutter (2) 306 is opened, the EL materials are emitted from openings 322 of each system (3) 318 of the evaporation sources (1) 303 and (2) 304 to perform evaporation on the substrate located on the upper portion of the system (3) 318. Note that coevaporation is performed in the case where a plurality of evaporation sources are used.

When the plural EL materials are separately applied onto the substrate, a shadow mask with openings may be provided between the shutter (2) 306 and the substrate. Note that a mask made from a metal plate or a glass plate can be used as the shadow mask.

An inner wall surface of the film formation chambers is generally made of a metal material such as aluminum or stainless steel (SUS). However, there is a problem that such a material emits an impurity such as oxygen or water. Thus, a material obtained by electrolytic-polishing the surface of the above metal material to a mirror state is used. Further, a material, of which the number of pores is extremely smaller than general ceramics and a surface area of the inner portion is small, is preferably used as a member to be used for the inner portion of the film formation chamber. This is because, by decreasing the surface area of the inner portion, desorption characteristic of the impurity such as oxygen or water is improved and impurity contamination in the film formation chamber is prevented. Note that these materials have smoothness such as average roughness in a center line is 1 to 30 angstroms.

Next, the case in which an EL material is purified by sublimation and then evaporation is performed by a method which is slightly different from the method described so far will be described.

Figure 4:
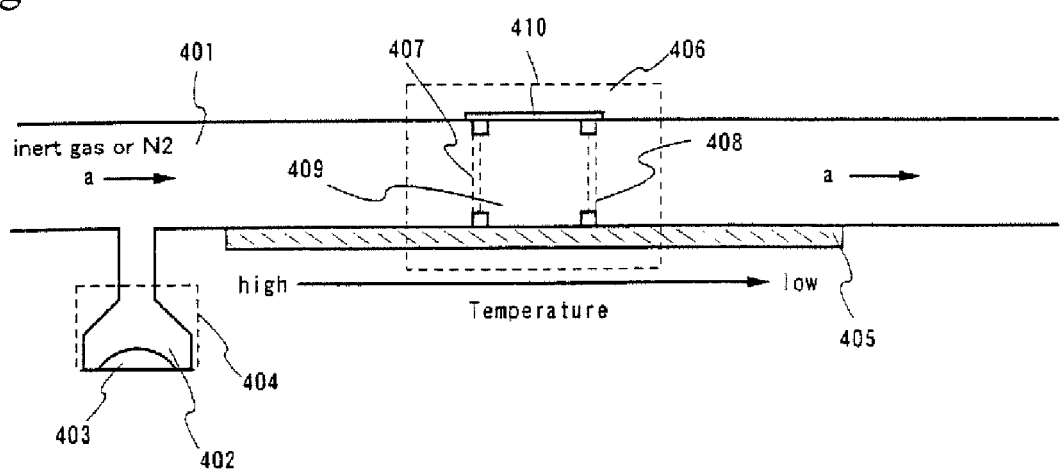
FIG. 4 is a diagram showing a structure of the film formation chamber.

In FIG. 4, reference numeral 401 denotes a separation pipe. An inert gas such as nitrogen or a noble gas flows into the inner portion thereof as a carrier gas. Note that as the gas introduced in the inner portion of the film formation apparatus of the present invention, a high purified gas obtained by a gas purifying unit before introducing into the apparatus is used. Therefore, it is necessary to provide the gas purifying unit in order that the high purified gas is obtained and then introduced into the film formation apparatus. Thus, since oxygen, water, and other impurity, which are included in the gas, can be removed in advance, it can be prevented that these impurities are introduced into the inner portion of the apparatus.

In a material chamber 402 there is provided an EL material 403. Also, the material chamber 402 has a heating mechanism 404 for evaporating the EL material 403. Note that when the EL material 403 is heated in advance before the EL material 403 is evaporated by the heating mechanism 404, the impurity such as water can be removed. A heating temperature at this time is preferably 200° C. or lower.

Further, although not shown here, the material chamber 402 is connected with a material exchange room through a gate. Note that a heater for heating an exchanged material is provided in the material exchange room. The material is heated in advance to remove the impurity such as water. A heating temperature at this time is desirably 200° C. or lower. Also, the material exchange chamber has an evacuation pump which is capable of making the inner portion a reduced pressure state. After the EL material is introduced from the outside, the inner portion is made to be a reduced pressure state. Then, when the material exchange chamber becomes the same pressure state as the inner portion of the material chamber 402, the gate is opened and thus an EL material can be set in the inner portion of the material chamber 402.

A gas EL material evaporated in the material chamber 402 is moved together with the carrier gas through inside the separation pipe 401 in a direction indicated by an arrow "a". Note that a temperature control mechanism 405, a heater for example, for controlling a temperature of the inner portion of the separate pipe 401 is provided therein.

The temperature control mechanism 405 is set so that a temperature is gradually decreased from a direction in which the gas EL material flows. Note that the temperature control mechanism 405 is set so that a temperature of the high temperature portion thereof is lower than the heating mechanism 404.

When the gas EL material is moved through the inner portion of the separate pipe with the temperature control mechanism, in accordance with different sublimation temperatures, the impurity (high temperature material) which has a higher sublimation temperature than the high purity EL material, the impurity (low temperature material) which has a low sublimation temperature, and the high purity EL material (middle temperature material) can be separated from one another and precipitated at every different temperature region.

Note that when a temperature, at which a pure EL material is precipitated, is measured in advance, the temperature and the position are easily controlled. Also, generally, a precipitation temperature is in the vicinity of ±10° C. from the melting point of the pure EL material. The separate pipe 401 is constructed so that a region 406 of the separate pipe 401 can be separated by gates (a) 407 and (b) 408 and then a temperature is preferably controlled so that the pure EL material is precipitated in this region. Note that when the separation of the separate pipe 401 is made by gates (a) 407 and (b) 408, an evaporation source separation chamber 409 can be constructed.

Note that, although not shown here, the separation pipe 401 is connected with the film formation chamber through a gate (c) 410. Thus, a structure of the film formation chamber connected with the separation pipe 401 will be described using FIGS. 5A and 5B.

Figure 5A:
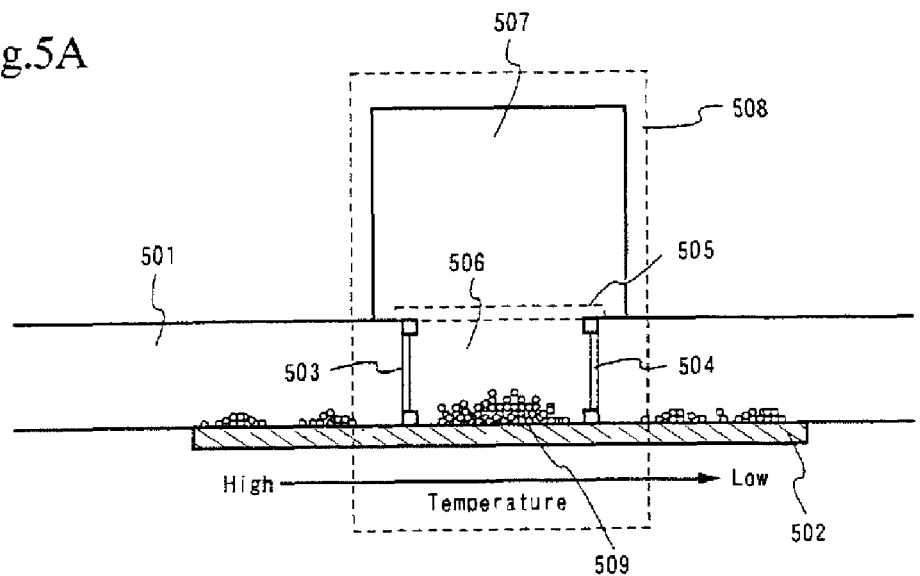
FIGS. 5A and 5B are diagrams showing structures of an evaporation chamber.

In FIG. 5A, the gas EL material inside a separation pipe 501 is separated and precipitated by a temperature control mechanism 502 and thus only a high purity EL material 509 is precipitated in the inner portion of an evaporation source separation chamber 506 isolated by gates (a) 503, (b) 504, and (c) 505. Note that the evaporation source separation chamber 506 is connected with a film formation chamber 507 through the gate (c) 505. That is, when the gate (c) 505 is opened, the high purity EL material can be evaporated in a region (a) 508.

Figure 5B:
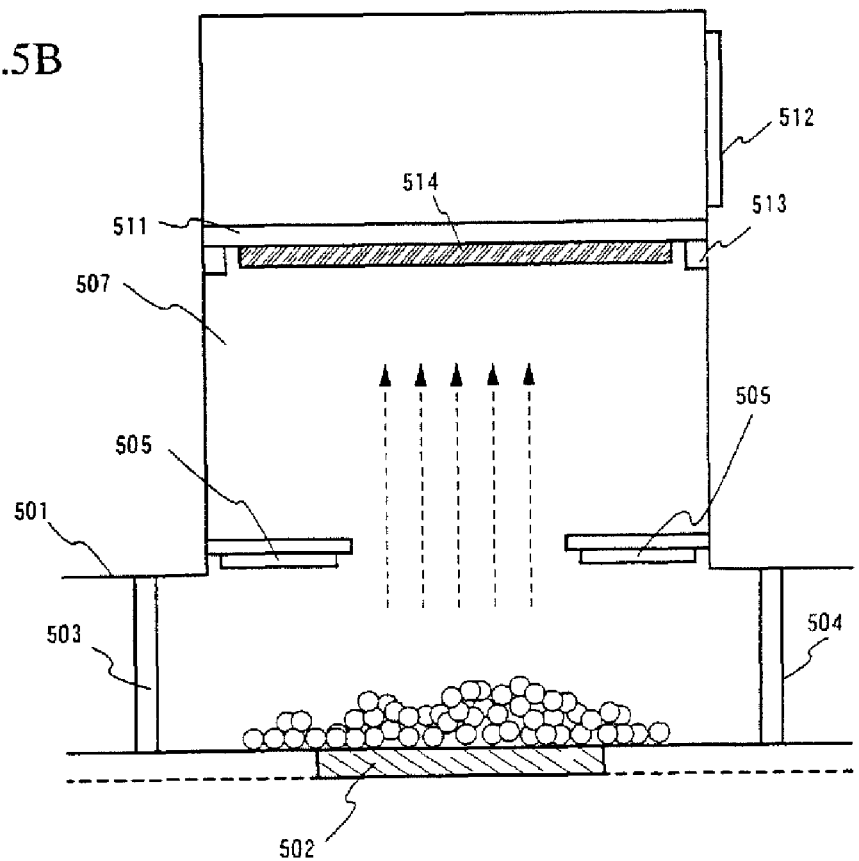

FIG. 5B is an enlarged view of the region (a) 508. A substrate 511 is passed through a gate (d) 512 and transferred to the film formation chamber 507. Also, the substrate 511 is held on a holder 513 so that a film formation surface is set to a lower surface to be evaporated.

Here, in order to form an EL layer, a pixel electrode (anode or cathode) 514 is formed in advance on the substrate.

[Embodiment 1]

Figure 6:
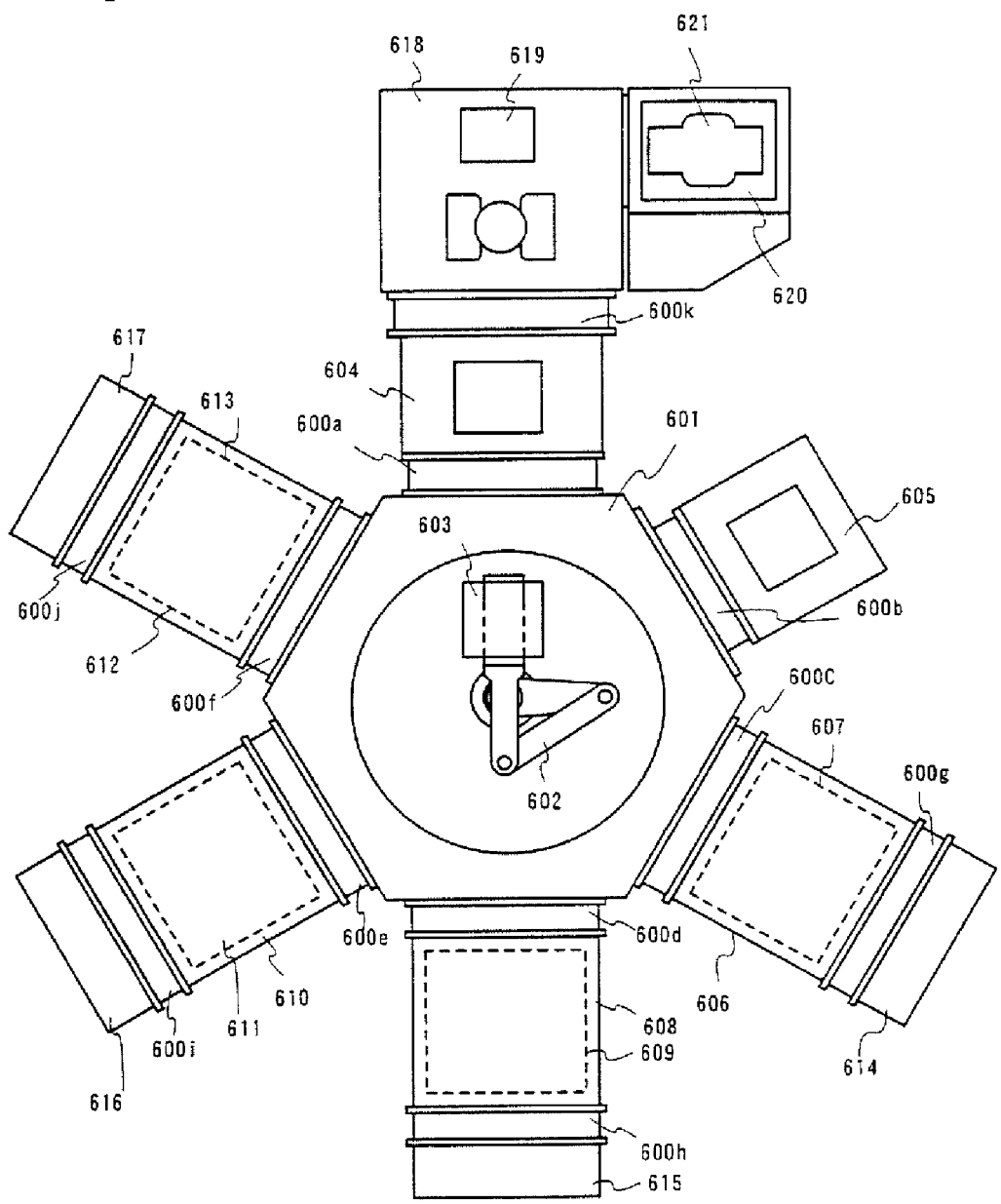
FIG. 6 is a diagram showing a structure of a film formation apparatus.

A film formation apparatus of the present invention will be described using FIG. 6. In FIG. 6, reference numeral 601 denotes a transfer chamber. The transfer chamber 601 is provided with a transfer mechanism (A) 602 and performs transfer of a substrate 603. The transfer chamber 601 is made to be in a reduced pressure atmosphere and connected with respective processing chambers through gates. Transfer of the substrate to the respective processing chambers is performed by the transfer mechanism (A) 602 when the gate is opened. When the pressure of the transfer chamber 601 is reduced, an evacuation pump such as a dry pump, a mechanical booster pump, a turbo molecular pump (magnetic levitation type), or a cryopump can be used. However, in order to obtain a high vacuum state with higher purity, the magnetic levitation turbo molecular pump is preferable.

Hereinafter, the respective processing chambers will be described. Note that since the transfer chamber 601 becomes in a reduced pressure atmosphere, all processing chambers, which are directly connected with the transfer chamber 601, have an evacuation pump (not shown). As the evacuation pump, the dry pump, the mechanical booster pump, the turbo molecular pump (magnetic levitation type), or the cryopump, which are described above, is used. However, the magnetic levitation turbo molecular pump is preferable even in this case.

First, reference numeral 604 denotes a load chamber for setting (locating) the substrate, which also serves as an unload chamber. The load chamber 604 is connected with the transfer chamber 601 through a gate 600a and a carrier (not shown) in which the substrate 603 is set is located therein. Note that the load chamber 604 may include a substrate transfer room and a substrate untransfer room separately. Also, the load chamber 604 has the above evacuation pump and a purge line for introducing a nitrogen gas or a noble gas with high purity. The turbo molecular pump is suitable as the evacuation pump. The purge line has a gas purifying unit so that the impurity (oxygen or water) of the gas introduced into the apparatus is removed in advance.

Note that, in this embodiment, a substrate which have formed a transparent conductive film which is the anode of an EL element, is used as the substrate 603. In this embodiment, the substrate 603 is set in the carrier so that a film-formed surface is located downward. This is for easily performing a face down method (also referred to as deposition up method) in conducting film formation by an evaporation method later. The face down method is a method of performing film formation in a state where the film-formed surface of the substrate is located downward. According to this method, the adhesion of dust or the like can be suppressed.

Next, reference numeral 605 denotes a processing chamber for processing the surface of the anode or the cathode (anode in this embodiment) of the EL element (hereinafter referred to as preprocessing chamber). The preprocessing chamber 605 is connected with the transfer chamber 601 through a gate 600b. The preprocessing chamber 605 can be variously changed in accordance with a manufacturing process of the EL element. In this embodiment, the preprocessing chamber 605 is constructed so that heating can be performed at 100 to 120° C. while the surface of the anode of the transparent conductive film is irradiated with ultraviolet light in an oxygen atmosphere. Such preprocessing is effective in the case where the surface of the anode of the EL element is processed.

As another preprocessing method, a method of performing heating at 200 to 400° C. during plasma irradiation in an oxygen atmosphere or a hydrogen atmosphere is also effective. In this case, the preprocessing chamber has preferably a mechanism which is capable of performing plasma processing and thermal treatment.

Next, reference numeral 606 denotes a film formation chamber for performing film formation using an organic EL material by an evaporation method. This chamber is called a film formation chamber (A). The film formation chamber (A) 606 is connected with the transfer chamber 601 through a gate 600c. In this embodiment, the film formation chamber which has the structure shown in FIGS. 3A to 3C is provided as the film formation chamber (A) 606.

In this embodiment, a light emitting layer for emitting a red color is formed in a film formation portion 607 of the film formation chamber (A) 606. Thus, of a plurality of evaporation sources included in the film formation chamber (A) 606, a shutter located in the upper portion of an evaporation source including the organic EL material to be the light emitting layer for emitting the red color is opened. Also, a shadow mask is set to selectively form the light emitting layer for emitting the red color. Note that the light emitting layer for emitting the red color can be formed using $Alq_3$ into which DCM is doped. In addition, an Eu complex ($Eu(DCM)_3$(Phen)), an aluminum quinolinolato complex ($Alq_3$) in which DCM-1 is used as a dopant, or the like can be used. Further, a known material can also be used.

Also, the film formation chamber (A) 606 is connected with a material exchange chamber 614 through a gate 600g. Note that, in the material exchange chamber 614, a heater for heating an exchanged material is provided. A material is heated in advance and thus the impurity such as water can be removed. At this time, a heating temperature is desirably 200° C. or lower. Also, the material exchange chamber 614 is provided with an evacuation pump which is capable of making the inner portion in a reduced pressure state. Thus, after addition or exchange of an evaporation material from the outside and thermal treatment are performed, the inner portion is made to be in a reduced pressure state. Then, when the material exchange chamber 614 becomes the same pressure state as the film formation chamber, the gate 600g is opened. Therefore, the evaporation material can be set in the evaporation source of the film formation chamber. Note that the evaporation material is set in the evaporation source of the film formation chamber by the transfer mechanism or the like.

Note that, with regard to a film formation process in the film formation chamber (A) 606, the description of FIGS. 3A to 3C may be referred to.

Next, reference numeral 608 denotes a film formation chamber for performing film formation using an organic EL material by an evaporation method. This chamber is called a film formation chamber (B). The film formation chamber (B) 608 is connected with the transfer chamber 601 through a gate 600d. In this embodiment, the film formation chamber which has the structure shown in FIGS. 3A to 3C is provided as the film formation chamber (B) 608. In this embodiment, a light emitting layer for emitting a green color is formed in a film formation portion 609 of the film formation chamber (B) 608. The light emitting layer for emitting the green color can be formed by coevaporating CBP and Ir(ppy) 3. In addition, an aluminum quinolinolato complex ($Alq_3$) or a benzoquinolinolato beryllium complex (BeBq) can be used. Further, an aluminum quinolinolato complex ($Alq_3$) in which a material such as coumarin 6 or quinacridon is used as a dopant can be used. Furthermore, a known material can be used.

Also, the film formation chamber (B) 608 is connected with a material exchange chamber 615 through a gate 600h. In the material exchange chamber 615, a heater for heating an exchanged material is provided. A material is heated in advance to remove the impurity such as water. At this time, a heating temperature is desirably 200° C. or lower. Also, the material exchange chamber 615 is provided with an evacuation pump which is capable of making the inner portion in a reduced pressure state. Thus, after an evaporation material is introduced from the outside, the inner portion is made to be in a reduced pressure state. Then, when the material exchange chamber 615 becomes the same pressure state as the film formation chamber, the gate 600h is opened. Therefore, the evaporation material can be set in the evaporation source of the film formation chamber. Note that the evaporation material is set in the evaporation source of the film formation chamber by the transfer mechanism or the like.

Note that, with regard to a film formation process in the film formation chamber (B) 608, the description of FIGS. 3A to 3C may be referred to.

Next, reference numeral 610 denotes a film formation chamber for performing film formation using an organic EL material by an evaporation method. This chamber is called a film formation chamber (C). The film formation chamber (C) 610 is connected with the transfer chamber 601 through a gate 600e. In this embodiment, the film formation chamber which has the structure shown in FIGS. 3A to 3C is provided as the film formation chamber (C) 610. In this embodiment, a light emitting layer for emitting a blue color is formed in a film formation portion 611 of the film formation chamber (C) 610. The light emitting layer for emitting the blue color can be formed using DPVBi as distyryl derivative, a zinc complex which has an azomethine compound as ligand, or DPVBi into which perylene is doped. Further, a known material may be used.

Also, the film formation chamber (C) 610 is connected with a material exchange chamber 616 through a gate 600i. In the material exchange chamber 616, a heater for heating an exchanged material is provided. A material is heated in advance to remove the impurity such as water. At this time, a heating temperature is desirably 200° C. or lower. Also, the material exchange chamber 616 has an evacuation pump which is capable of making the inner portion in a reduced pressure state. Thus, after an evaporation material is introduced from the outside, the inner portion is made to be in a reduced pressure state. Then, when the material exchange chamber 616 becomes the same pressure state as the film formation chamber, the gate 600i is opened. Therefore, the evaporation material can be set in the evaporation source of the film formation chamber. Note that the evaporation material is set in the evaporation source of the film formation chamber by the transfer mechanism or the like.

Note that, with regard to a film formation process in the film formation chamber (C) 610, the description of FIGS. 3A to 3C may be referred to.

Note that, in this embodiment, the example in which the light emitting layer is directly formed on the anode or the cathode of the EL element, is described. However, a hole injection layer or a hole transport layer may be formed before the formation of the light emitting layer. Note that, for the hole injection layer, copper phthalocyanine, PEDOT as polythiophene derivative, or the like can be used. For the hole transport layer, MTDATA (4,4',4''-tris(3-methylp henylphenylamino)triphenylamine), á-NPD, or the like can be used. Note that when a layer made of a polymer material is formed, a film formation chamber which is capable of performing spin coat processing may be provided instead of the above film formation chamber.

Also, after the formation of the light emitting layer, an electron transport layer or an electron injection layer may be formed. Note that, for the electron transport layer, a material such as 1,3,4-oxadiazole derivative or 1,2,4-triazole derivative (TAZ) can be used. As a buffer layer, a layer made of a material such as lithium fluoride (LiF), aluminum oxide ($Al_2O_3$) or lithium acetylacetonate (Liacac) may be formed.

Next, reference numeral 612 denotes a film formation chamber for forming a conductive film which is to be the anode or the cathode (metal film as the cathode in this embodiment) of an EL element by an evaporation method. This chamber is called a film formation chamber (D). The film formation chamber (D) 612 is connected with the transfer chamber 601 through a gate 600f. In this embodiment, an Al—Li alloy film (alloy film of aluminum and lithium) as the conductive film, to become the cathode of the EL element, is formed in a film formation portion 613 of the film formation chamber (D) 612. Note that an element which belongs to the group 1 or 2 of the periodic table (element periodic law) and aluminum can be coevaporated. The coevaporation indicates an evaporation method of simultaneously heating evaporation cells to mix different substances in a film formation stage.

Also, the film formation chamber (D) 612 is connected with a material exchange chamber 617 through a gate 600j. Note that, in the material exchange chamber 617, a heater for heating an exchanged material is provided. A material is heated in advance and thus the impurity such as water can be removed. At this time, a heating temperature is desirably 200° C. or lower. Also, the material exchange chamber 617 is provided with an evacuation pump which is capable of making the inner portion in a reduced pressure state. Thus, after an evaporation material is introduced from the outside, the inner portion is made to be in a reduced pressure state. Then, when the material exchange chamber 617 becomes the same pressure state as the film formation chamber, the gate 600j is opened. Therefore, the evaporation material can be set in the evaporation source of the film formation chamber.

By providing the film formation chamber (A) 606, the film formation chamber (B) 608, the film formation chamber (C) 610, and the film formation chamber (D) 612 with a CCD (charge coupled device) known as an image sensor therein, when film formation using a metal mask is performed, position alignment between the substrate and the metal mask can be performed with high precision.

Also, the film formation chamber (A) 606, the film formation chamber (B) 608, the film formation chamber (C) 610, and the film formation chamber (D) 612 are provided with a mechanism for heating the inner portion of the film formation chambers. Thus, a part of the impurity in the film formation chamber can be removed.

As an evacuation pump provided with the respective film formation chambers, a dry pump, a mechanical booster pump, a turbo molecular pump (magnetic levitation type), or a cryopump can be used. In this embodiment, the cryopump or the dry pump is preferable.

The pressure in the film formation chamber (A) 606, the film formation chamber (B) 608, the film formation chamber (C) 610, and the film formation chamber (D) 612 is reduced by the evacuation pump. Note that, at this time, a degree of vacuum to be reached is desirably $10^{-6}$ Pa or higher. For example, a cryopump with an evacuation speed of 10000 l/s ($H_2O$) is used, a surface area of the inner portion of the film formation chamber is set to be 10 m², and the inner portion of the film formation chamber is made of aluminum. In this case, the amount of leak in the inner portion of the film formation chamber is required to be $4.1 \times 10^{-7}$ Pa·m³·s⁻¹ for 20 hours or smaller. In order to obtain such a degree of vacuum, it is effective to reduce the surface area of the inner portion of the film formation chamber by electrolytic polishing.

Next, reference numeral 618 denotes a sealing chamber (also referred to as enclosing chamber or glove box). This chamber is connected with the load chamber 604 through a gate 600k. In the sealing chamber 618, processing for finally sealing the EL element into a closed space is performed. This processing is a processing for protecting the formed EL element from oxygen and moisture. Thus, means for mechanically sealing the EL element using a cover member or means for sealing the EL element using a thermal curable resin or an ultraviolet light curable resin is used.

The cover member can be formed using glass, ceramics, plastic, or metal. However, when light is emitted to the cover member side, the cover member with translucency is required. The cover member and the substrate in which the above EL element is formed are adhered to each other using a seal material such as a thermal curable resin or an ultraviolet light curable resin. Then, the resin is cured by thermal treatment or ultraviolet light irradiation processing to form the closed space. It is also effective that a moisture absorption material represented by barium oxide is provided in this closed space.

Also, a space formed between the cover member and the substrate in which the EL element is formed can be filled with a thermal curable resin or an ultraviolet light curable resin. In this case, it is effective that a moisture absorption material represented by barium oxide is added into the thermal curable resin or the ultraviolet light curable resin.

In the film formation apparatus shown in FIG. 6, a mechanism 619 for irradiating ultraviolet light to the inner portion of the sealing chamber 618 (hereinafter referred to as an ultraviolet light irradiating mechanism) is provided and has a construction that an ultraviolet light curable resin is cured by ultraviolet light emitted from the ultraviolet light irradiating mechanism 619. The inner portion of the sealing chamber 618 can be made to be in a reduced pressure state by attaching an evacuation pump. When the above sealing step is mechanically performed by robot operation, contamination of oxygen and moisture can be prevented if the step is performed under a reduced pressure. Note that, concretely, it is desirable that the concentration of oxygen and water is 0.3 ppm or lower. On the other hand, the inner portion of the sealing chamber 618 can be made to be in a pressurized state. In this case, purging is performed using a nitrogen gas or a noble gas with high purity to make a pressurized state. Thus, contamination of oxygen and the like from the outside are prevented.

Next, a passing chamber (pass box) 620 is connected with the sealing chamber 618. A transfer mechanism (B) 621 is provided in the passing chamber 620 and the substrate, in which sealing of the EL element is completed in the sealing chamber 618, is transferred to the passing chamber 620. The passing chamber 620 can be also made to be a reduced pressure state by attaching an exhaust pump thereto. The passing chamber 620 is a facility for unexposing the sealing chamber 618 to the outside air directly and the substrate is taken out therefrom. In addition, a member supply chamber for supplying a member used in the sealing chamber can be provided.

Note that, although not shown in this embodiment, after the formation of the EL element, a compound containing silicon such as silicon nitride or silicon oxide, or an insulating film in which a DLC (diamond like carbon) film containing carbon is laminated on the above compound may be formed on the EL element. Note that the DLC (diamond like carbon) film is an amorphous film in which diamond bond ($sp^3$ bond) and graphite bond ($SP^2$ bond) are mixed. In this case, a film formation chamber which has a CVD (chemical vapor deposition) apparatus for generating plasma by applying a self bias to form a thin film by plasma discharge decomposition of a raw material gas, is preferably provided.

Note that oxygen ($O_2$), hydrogen ($H_2$), methane ($CH_4$), ammonia ($NH_3$), and silane ($SiH_4$) can be used in the film formation chamber which has the CVD (chemical vapor deposition) apparatus. Also, as the CVD apparatus, one which has parallel plate electrodes and an RF (13.56 MHZ) power source can be used.

Further, a film formation chamber for performing film formation by a sputtering method (also referred to as sputter method) can be provided since film formation by sputtering is effective in the case where the anode is formed after the EL layer is formed on the cathode of the EL element, that is, in the case where the pixel electrode is the cathode. Note that, when the inner portion of the film formation chamber at film formation is made to be an atmosphere in which oxygen is added into argon, an oxygen concentration in a formed film can be controlled and thus a film with a high transmittance and a low resistance can be formed. Also, as in the cases of other film formation chambers, it is desirable that the film formation chamber is isolated from the transfer chamber by the gate.

Further, in the film formation chamber for performing sputtering, a mechanism for controlling a temperature of the film-formed substrate may be provided. The film-formed substrate is desirably kept at 20 to 150° C. Also, as an exhaust pump provided in the film formation chamber, a dry pump, a mechanical booster pump, a turbo molecular pump (magnetic levitation type), a cryopump, or the like can be used. In this embodiment, the turbo molecular pump (magnetic levitation type) or the dry pump is preferable.

As described above, when the film formation apparatus shown in FIG. 6 is used, the EL element is completely sealed into the closed space without exposure to the outside air. Thus, a light emitting device with high reliability can be manufactured.

Figure 11:
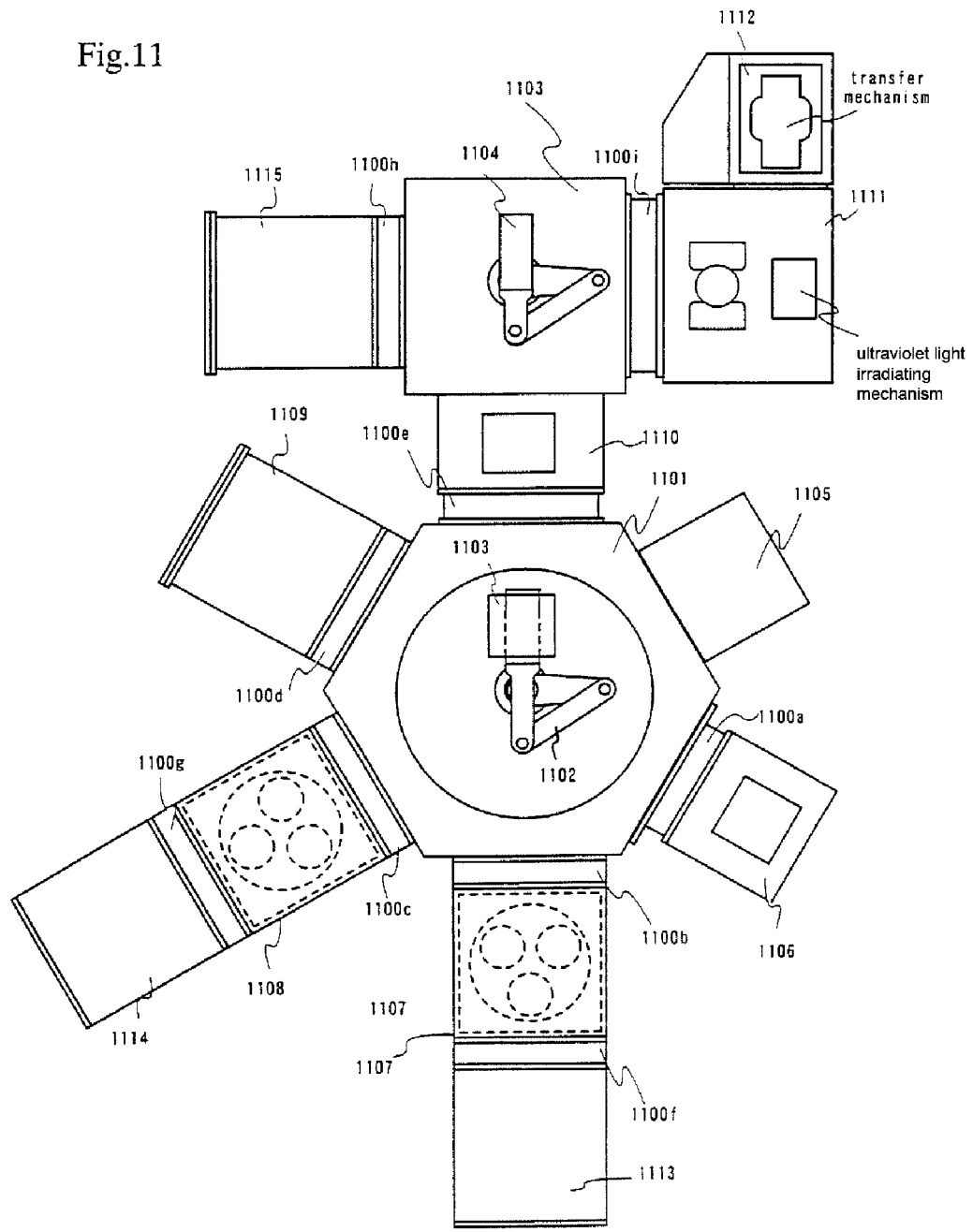
FIG. 11 is a diagram showing the structure of a film formation apparatus.

Further, a film formation apparatus which has an arrangement different from that described in this embodiment is shown in FIG. 11. The film formation apparatus shown in FIG. 6 is constructed of, in addition to the load chamber and the preprocessing chamber, three film formation chambers for performing film formation using the EL material, one film formation chamber for performing film formation using the metal material, the sealing chamber, and the passing chamber. On the other hand, the film formation apparatus shown in FIG. 11 is constructed of transfer chambers (1101 and 1103) which has transfer mechanisms (1102 and 1104), a load chamber 1105, a preprocessing chamber 1106, a film formation chamber (A) 1107 for performing film formation using an EL material, a film formation chamber (B) 1108 for performing film formation using a metal material, a film formation chamber (C) 1109 for performing sputter processing, a transfer chamber 1110, a film formation chamber (D) 1115 for performing CVD processing, gates (1100*a* to 1100*i*), a sealing chamber 1111, and a passing chamber 1112. Note that material exchange chambers (1113 and 1114) are connected with the film formation chamber (A) 1107 for performing film formation of the EL material and the film formation chamber (B) 1108 for performing film formation of the metal material through the gates, respectively. However, the film formation chambers may be overlapped with the material exchange chambers (1113 and 1114) and then the material exchange chambers are drawn out at sample exchange to exchange samples. Note that these processing chambers which are provided in the film formation apparatus shown in FIG. 11 have functions described in this embodiment and can perform processings described in this embodiment.

[Embodiment 2]

Figure 7:
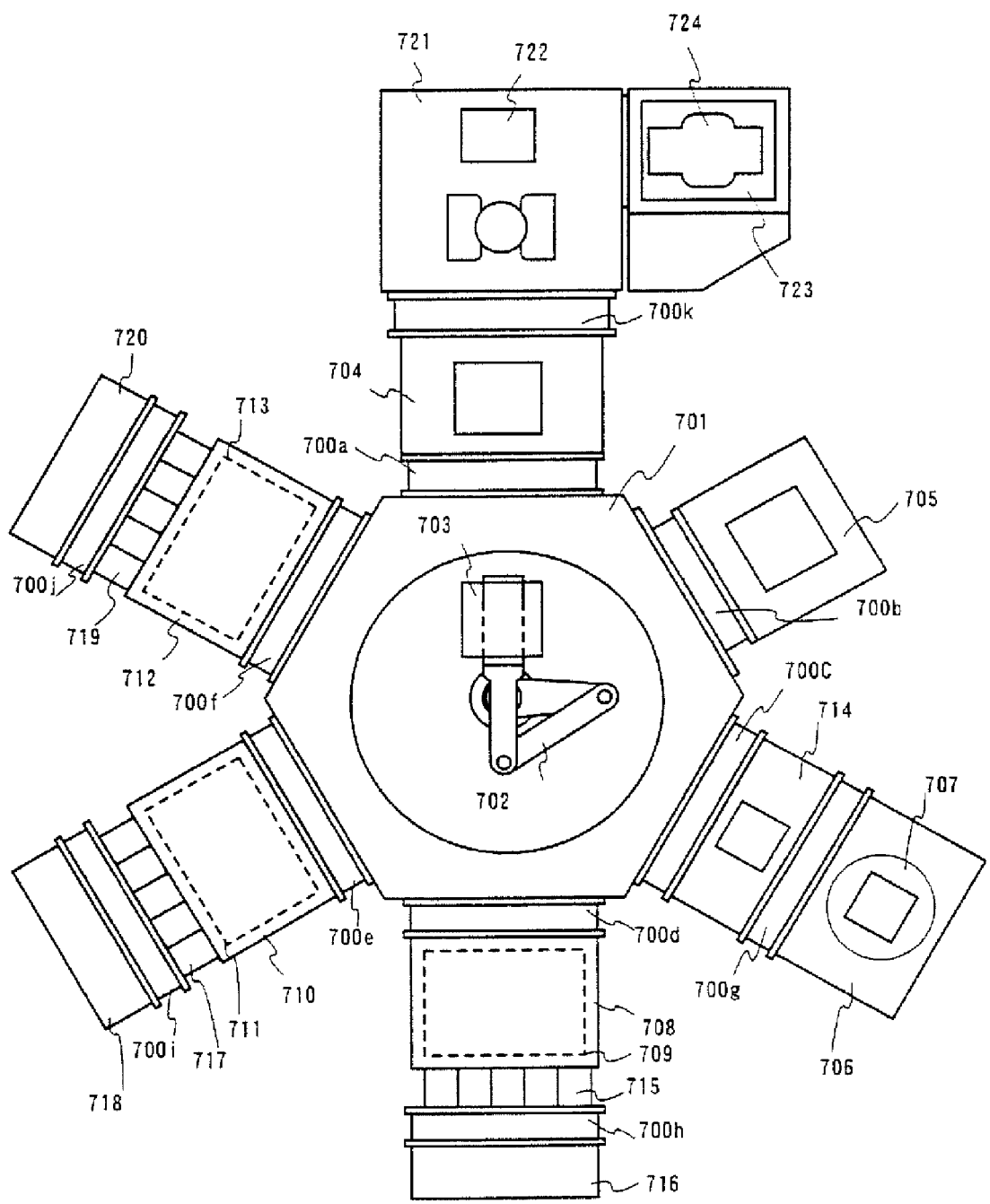
FIG. 7 is a diagram showing the structure of a film formation apparatus.

The case of a film formation apparatus of the present invention employing a multi-chamber system (also referred to as a cluster tool system) will be described with reference to FIG. 7. In FIG. 7, reference numeral 701 denotes a transfer chamber. The transfer chamber 701 is provided with a transfer mechanism (A) 702 and performs transfer of a substrate 703. The transfer chamber 701 is made to be in a reduced pressure atmosphere and connected with respective processing chambers through gates. Transfer of the substrate to the respective processing chambers is performed by the transfer mechanism (A) 702 when the gate is opened. When the pressure of the transfer chamber 701 is reduced, an exhaust pump such as a dry pump, a mechanical booster pump, a turbo molecular pump (magnetic levitation type), or a cryopump can be used. However, in order to obtain a high vacuum state with higher purity, the magnetic levitation turbo molecular pump is preferable.

Hereinafter, the respective processing chambers will be described. Note that the transfer chamber 701 becomes to be in a reduced pressure atmosphere. Thus, all processing chambers directly connected with the transfer chamber 701 are provided with an exhaust pump (not shown). As the exhaust pump, the dry pump, the mechanical booster pump, the turbo molecular pump, or the cryopump, which are described above, is used. However, the magnetic levitation turbo molecular pump is preferable as in the above case.

With respect to the gates, in order to make the respective processing chambers and the transfer chamber a complete closed space, an O ring and the like are used to improve airtightness. Note that, in order to prevent impurity contamination inside the apparatus, an O ring in which the amount of degassing is further reduced is preferably used.

First, reference numeral 704 denotes a load chamber for setting (locating) the substrate, which is also called a load lock chamber. The load chamber 704 is connected with the transfer chamber 701 through a gate 700*a* and a carrier (not shown) in which the substrate 703 is set is located therein. Note that the load chamber 704 may include a substrate transfer room and a substrate untransfer room separately.

Also, the load chamber 704 has the above exhaust pump and a purge line for introducing a nitrogen gas or a noble gas with high purity.

Next, reference numeral 705 denotes a preprocessing chamber for processing the surface of the anode or the cathode (anode in this embodiment) of the EL element. The preprocessing chamber 705 is connected with the transfer chamber 701 through a gate 700*b*. The preprocessing chamber can be variously changed in accordance with a manufacturing process of the EL element. In this embodiment, the preprocessing chamber is constructed so that heating can be performed at 100 to 120° C. while the surface of the anode of the transparent conductive film is irradiated with ultraviolet light in an oxygen atmosphere. Such preprocessing is effective in the case where the surface of the anode of the EL element is processed.

Next, reference numeral 706 denotes an application chamber for performing film formation of an organic EL material by an evaporation method and this chamber is called an application chamber. Note that a vacuum exhaust processing chamber 714 is provided between the application chamber 706 and the transfer chamber 701 in order that processing in a normal pressure (atmospheric pressure) is allowed in only the application chamber 706.

According to Embodiment 1, all of the inner portions of the film formation apparatus becomes to be in the reduced pressure state and thus the example, in which an EL layer such as a hole injection layer, a hole transport layer, a light emitting layer, an electron transport layer, or an electron injection layer is formed under the reduced pressure, is described. However, when the EL layer is formed using a polymer material, the formation is performed under a normal pressure in an atmosphere which is filled with an inert gas such as nitrogen or a noble gas. Thus, when the substrate is transferred to the application chamber 706, it is required that a pressure difference between the application chamber 706 and the other inner portion of the film formation apparatus is suppressed.

Therefore, in this embodiment, first, the pressure of the vacuum evaporation processing chamber 714 is reduced to the same pressure as that of the transfer chamber 701 and a gate 700*c* is opened under this state to transfer the substrate thereto. After that, the gate 700*c* is closed and then purging with an inert gas is performed for the inside of the vacuum evaporation processing chamber 714. When it is returned to be in a normal pressure, a gate 700*g* is opened to transfer the substrate to the application chamber 706. Here, a stage may be transferred together with the substrate, or the substrate may be transferred by a specific transfer means.

Note that, in this embodiment, the case in which the hole injection layer is formed using a polymer material will be described. As the polymer material used here, PEDOT (polyethylenedioxy thiophene) as polythiophene derivative is preferable. However, other known polymer EL material can be used.

Then, the hole injection layer is formed by a spin coat method in the application chamber 706. Note that a heating mechanism with a function for performing drying after application may be provided in the application chamber 706.

After the hole injection layer is formed by the above process, the gate 700*g* is opened to transfer the substrate to the vacuum exhaust processing chamber 714. Then, in a state that the gates 700*g* and 700*c* are closed, vacuum exhaustion is performed. Thus, when the vacuum exhaustion processing chamber 714 reaches the same reduced pressure state as that of the transfer chamber 701, the gate 700*c* is opened to transfer the substrate to the transfer chamber 701.

Next, reference numeral 708 denotes a film formation chamber for performing film formation of an organic EL material by an evaporation method. This chamber is called a film formation chamber (A). The film formation chamber (A) 708 is connected with the transfer chamber 701 through a gate 700*d*. In this embodiment, the film formation chamber which has the structure shown in FIGS. 5A and 5B is provided as the film formation chamber (A) 708. In this embodiment, respective light emitting layers for emitting a red color, a green color and a blue color are formed in a film formation portion 709 of the film formation chamber (A) 708. Note that the light emitting layers for emitting the red color, the green color and the blue color may be formed by using known materials in addition to the materials described in Embodiment 1. Also, these materials are provided in respective different evaporation sources. Thus, film formation is performed in predetermined positions using a shadow mask for each of the colors.

Further, plural evaporation materials provided in the film formation chamber (A) 708 are respectively purified by sublimation through a separation pipe 715 and then evaporated. Also, these evaporation materials are added or exchanged in a material exchange chamber 716 connected with the separation pipe 715 through a gate 700*h*. Note that, in the material exchange chamber 716, a heater for heating the exchanged material is provided. A material is heated in advance to thereby remove the impurity such as water. At this time, a heating temperature is desirably 200° C. or less. Also, the material exchange chamber 716 is provided with an exhaust pump which is capable of making the inner portion in a reduced pressure state. Thus, after the evaporation material is introduced from the outside, the inner portion is made to be in a reduced pressure state. Then, when the material exchange chamber becomes in the same pressure state as that of the film formation chamber, the gate 700*h* is opened, to thereby provide the evaporation material in the evaporation source inside the film formation chamber.

Next, reference numeral 710 denotes a film formation chamber for performing film formation of an organic EL material by an evaporation method. This chamber is called a film formation chamber (B). The film formation chamber (B) 710 is connected with the transfer chamber 701 through a gate 700*e*. In this embodiment, the film formation chamber with the structure shown in FIGS. 5A and 5B is provided as the film formation chamber (B) 710. In this embodiment, the electron transport layer or the electron injection layer is formed in a film formation portion 711 of the film formation chamber (B) 710. Note that the electron transport layer or the electron injection layer may be formed by using a known material.

Further, plural evaporation materials provided in the film formation chamber (B) 710 are respectively purified by sublimation through a separation pipe 717 and then evaporated. Also, these evaporation materials are added or exchanged in a material exchange chamber 718 connected with the separation pipe 717 through a gate 700*i*. Note that, in the material exchange chamber 718, a heater for heating the exchanged material is provided. A material is heated in advance to thereby remove the impurity such as water. At this time, a heating temperature is desirably 200° C. or less. Also, the material exchange chamber 718 is provided with an exhaust pump which is capable of making the inner portion in a reduced pressure state. Thus, after the evaporation material is introduced from the outside, the inner portion is made to be in a reduced pressure state. Then, when the material exchange chamber becomes in the same pressure state as that of the film formation chamber, the gate 700i is opened to thereby provide the evaporation material in the evaporation source inside the film formation chamber.

Next, reference numeral 712 denotes a film formation chamber for forming a conductive film as the anode or the cathode (metal film as the cathode in this embodiment) of an EL element by an evaporation method. This chamber is called a film formation chamber (C). The film formation chamber (C) 712 is connected with the transfer chamber 701 through a gate 700f. In this embodiment, the film formation chamber with the structure shown in FIGS. 5A and 5B is provided as the film formation chamber (C) 712. In this embodiment, an Al—Li alloy film (alloy film of aluminum and lithium) as the conductive film to become the cathode of the EL element is formed in a film formation portion 713 inside the film formation chamber (C) 712. Note that an element which belongs to the group 1 or 2 of the periodic table and aluminum can be coevaporated.

Further, plural evaporation materials provided in the film formation chamber (C) 712 are respectively purified by sublimation through a separation pipe 719 and then evaporated. Also, these evaporation materials are added or exchanged in a material exchange chamber 720 connected with the separation pipe 719 through a gate 700j. Note that, in the material exchange chamber 720, a heater for heating the exchanged material is provided. A material is heated in advance to thereby remove the impurity such as water. At this time, a heating temperature is desirably 200° C. or less. Also, the material exchange chamber 720 is provided with an exhaust pump which is capable of making the inner portion in a reduced pressure state. Thus, after the evaporation material is introduced from the outside, the inner portion is made to be in a reduced pressure state. Then, when the material exchange chamber becomes in the same pressure state as that of the film formation chamber, the gate 700j is opened, to thereby provide the evaporation material in the evaporation source inside the film formation chamber.

Next, reference numeral 721 denotes a sealing chamber, which is connected with the load chamber 704 through a gate 700k. As the description of the sealing chamber 721, Embodiment 1 may be referred to. As in Embodiment 1, an ultraviolet light irradiating mechanism 722 is provided in the inner portion of the sealing chamber 721. Further, a passing chamber 723 is connected with the sealing chamber 721. A transfer mechanism (B) 724 is provided in the passing chamber 723, and after sealing of the EL element is completed in the sealing chamber 721, the substrate is transferred to the passing chamber 723. As the description of the passing chamber 723, Embodiment 1 may be referred to.

As described above, when the film formation apparatus shown in FIG. 7 is used, the EL element is completely sealed into the closed space without exposure to the outside air. Thus, an EL display device with high reliability can be manufactured. Note that the structure of this embodiment can be embodied by freely combining any structure described in Embodiment 1.

[Embodiment 3]

Figure 8:
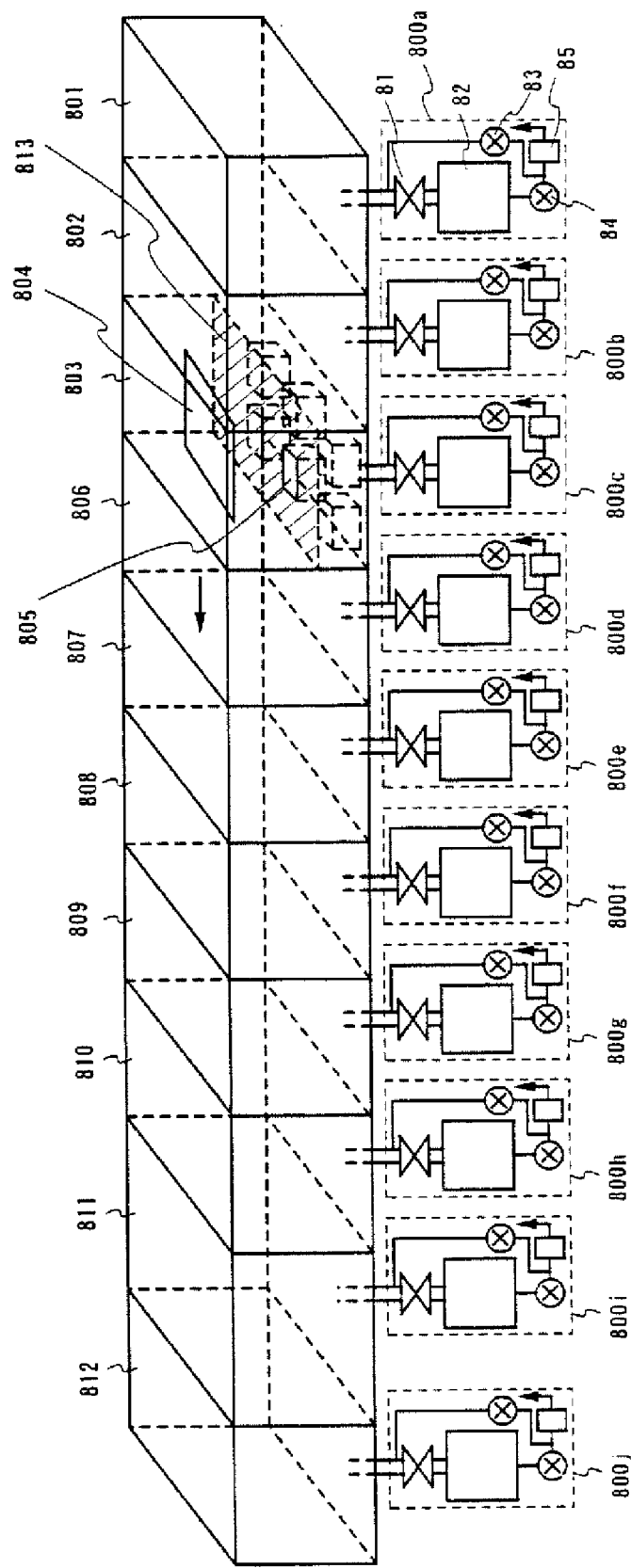
FIG. 8 is a diagram showing the structure of a film formation apparatus.

The case of using a film formation apparatus of the present invention with an in-line system will be described with reference to FIG. 8. In FIG. 8, reference numeral 801 denotes a load chamber, from which transfer of a substrate is started. The load chamber 801 is provided with an exhaust system 800a. The exhaust system 800a has a construct including a first valve 81, a turbo molecular pump 82, a second valve 83, a third valve 84, and a dry pump 85.

Also, in this embodiment, the following materials are used for the inner portions of the respective processing chambers such as the load chamber, a preprocessing chamber, film formation chambers, a sealing chamber, and an unload chamber, which are isolated by gates. Thus, a material such as aluminum or stainless steel (SUS), which is electrolytic-polished to make it a mirror state, is used for the inner wall surface because, by decreasing the surface area of the inner portion, desorption characteristic of the impurity such as oxygen or water can be reduced. Also, an inner portion member made of a material such as ceramics processed so that the number of pores is extremely decreased is used. Note that these materials have surface smoothness with the average roughness in a center line of 30 angstroms or less.

The first valve 81 is a main valve with a gate valve, and there is also the case where a butterfly valve which also serves as a conductance valve is used as the first value 81. The second valve 83 and the third valve 84 are fore valves. First, the second valve 83 is opened and then the pressure of the load chamber 801 is roughly reduced by the dry pump 84. Next, the first valve 81 and the third valve 84 are opened and then the pressure of the load chamber 801 is reduced to a high vacuum by the turbo molecular pump 82. Note that a mechanical booster pump may be used instead of the turbo molecular pump. Also, the turbo molecular pump may be used after a degree of vacuum is improved with the mechanical booster pump.

Next, reference numeral 802 denotes a preprocessing chamber for processing the surface of the anode or the cathode (anode in this embodiment) of the EL element. The preprocessing chamber 802 is provided with an exhaust system 800b. Also, the preprocessing chamber 802 is closed and isolated from the load chamber 801 by a gate which is not shown. The preprocessing chamber 802 can be variously changed in accordance with a manufacturing process of the EL element. In this embodiment, the preprocessing chamber 802 is constructed so that heating can be performed at 100 to 120° C. while the surface of the anode of the transparent conductive film is irradiated with ultraviolet light in an oxygen atmosphere. In addition, a method of performing thermal treatment at 200 to 400° C. while irradiating plasma in an oxygen atmosphere or in a hydrogen atmosphere may be used.

Next, reference numeral 803 denotes a film formation chamber for performing film formation of an organic EL material by an evaporation method, and this chamber is called a film formation chamber (A). The film formation chamber (A) 803 is provided with an exhaust system 800c. Also, the film formation chamber (A) 803 is closed and isolated from the preprocessing chamber 802 by a gate which is not shown. In this embodiment, the film formation chamber with the structure shown in FIGS. 3A to 3C is provided as the film formation chamber (A) 803.

Film formation is performed to a substrate 804 transferred to the film formation chamber (A) 803 by using, of a plurality of evaporation sources 805 provided in the film formation chamber (A) 803, an evaporation source (evaporation source (a) 805 in this embodiment) in which a shutter 813 is opened. Note that as the detailed operation of the film formation chamber (A) 803, the description of FIGS. 3A to 3C may be referred to. In this embodiment, a hole injection layer, a hole transport layer, or both the hole injection layer and the hole transport layer are formed in the film formation chamber (A) 803. Known materials may be used as materials for forming the hole injection layer and the hole transport layer.

Next, reference numeral 806 denotes a film formation chamber for performing film formation of an organic EL material by an evaporation method, and this chamber is called a film formation chamber (B). The film formation chamber (B) 806 is provided with an exhaust system 800*d*. Also, the film formation chamber (B) 806 is closed and isolated from the film formation chamber (A) 803 by a gate which is not shown. In this embodiment, the film formation chamber with the structure shown in FIGS. 3A to 3C is provided as the film formation chamber (B) 806. Thus, as the detailed operation of the film formation chamber (B) 806, the description of FIGS. 3A to 3C may be referred to. Also, in this embodiment, a light emitting layer for emitting a red color is formed in the film formation chamber (B) 806. The light emitting layer for emitting the red color is preferably formed by using a known material.

Next, reference numeral 807 denotes a film formation chamber for performing film formation of an organic EL material by an evaporation method. This chamber is called a film formation chamber (C). The film formation chamber (C) 807 has an exhaust system 800*e*. Also, the film formation chamber (C) 807 is closed and isolated from the film formation chamber (B) 806 by a gate which is not shown. In this embodiment, the film formation chamber with the structure shown in FIGS. 3A to 3C is provided as the film formation chamber (C) 807. Thus, as the detailed operation of the film formation chamber (C) 807, the description of FIGS. 3A to 3C may be referred to. Also, in this embodiment, a light emitting layer for emitting a green color is formed in the film formation chamber (C) 807. The light emitting layer for emitting the green color is preferably formed by using a known material.

Next, reference numeral 808 denotes a film formation chamber for performing film formation of an organic EL material by an evaporation method, and this chamber is called a film formation chamber (D). The film formation chamber (D) 808 is provided with an exhaust system 800*f*. Also, the film formation chamber (D) 808 is closed and isolated from the film formation chamber (C) 807 by a gate which is not shown. In this embodiment, the film formation chamber with the structure shown in FIGS. 3A to 3C is provided as the film formation chamber (D) 808. Thus, as the detailed operation of the film formation chamber (D) 808, the description of FIGS. 3A to 3C may be referred to. Also, in this embodiment, a light emitting layer for emitting a blue color is formed in the film formation chamber (D) 808. The light emitting layer for emitting the blue color is preferably formed by using a known material.

Next, reference numeral 809 denotes a film formation chamber for performing film formation of an organic EL material by an evaporation method, and this chamber is called a film formation chamber (E). The film formation chamber (E) 809 is provided with an exhaust system 800*g*. Also, the film formation chamber (E) 809 is closed and isolated from the film formation chamber (D) 808 by a gate which is not shown. In this embodiment, the film formation chamber with the structure shown in FIGS. 3A to 3C is provided as the film formation chamber (E) 809. Thus, as the detailed operation of the film formation chamber (E) 809, the description of FIGS. 3A to 3C may be referred to. Also, in this embodiment, an electron transport layer or an electron injection layer is formed in the film formation chamber (E) 809. A known material may be used as a material for forming the electron transport layer or the electron injection layer.

Next, reference numeral 810 denotes a film formation chamber for forming a conductive film as the anode or the cathode (metal film as the cathode in this embodiment) of the EL element by an evaporation method, and this chamber is called a film formation chamber (F). The film formation chamber (F) 810 is provided with an exhaust system 800*h*. Also, the film formation chamber (F) 810 is closed and isolated from the film formation chamber (E) 809 by a gate which is not shown. In this embodiment, the film formation chamber with the structure shown in FIGS. 3A to 3C is provided as the film formation chamber (F) 810. Thus, as the detailed operation of the film formation chamber (F) 810, the description of FIGS. 3A to 3C may be referred to.

In this embodiment, an Al—Li alloy film (alloy film of aluminum and lithium) as the conductive film to become the cathode of the EL element is formed in the film formation chamber (F) 810. Note that an element which belongs to the group 1 or 2 of the periodic table and aluminum can be coevaporated.

Also, a CVD chamber is provided as described in Embodiment 1 and then an insulating film such as a silicon nitride film, a silicon oxide film, or a DLC film may be formed as a protective film (passivation film) of the EL element.

When the CVD chamber is provided, a gas purifying unit, for making a material gas to be used in the CVD chamber have higher purity in advance, is preferably provided.

Next, reference numeral 811 denotes a sealing chamber, and the sealing chamber 811 is provided with an exhaust system 800*i*. Also, the sealing chamber 811 is closed and isolated from the film formation chamber (F) 810 by a gate which is not shown. As the description of the sealing chamber 811, Embodiment 1 may be referred to. As in Embodiment 1, an ultraviolet light irradiating mechanism (not shown) is provided in the inner portion of the sealing chamber 811.

Finally, reference numeral 812 denotes an unload chamber, and the unload chamber 812 is provided with an exhaust system 800*j*. The substrate in which the EL element is formed is taken out from here.

As described above, when the film formation apparatus shown in FIG. 8 is used, the EL element is completely sealed into the closed space without exposure to the outside air. Thus, a light emitting device with high reliability can be manufactured. Also, the light emitting device can be manufactured with a high throughput by using the in-line system. Note that the structure of this embodiment can be embodied by freely combining any structure described in Embodiment 1.

[Embodiment 4]

In this embodiment, a light emitting device after processing up to a sealing (or enclosing) step for protecting an EL element using the film formation apparatus of the present invention will be shown. Further, a method of preventing deterioration of the EL element due to an impurity in a manufacturing step will also be described.

Figure 9A:
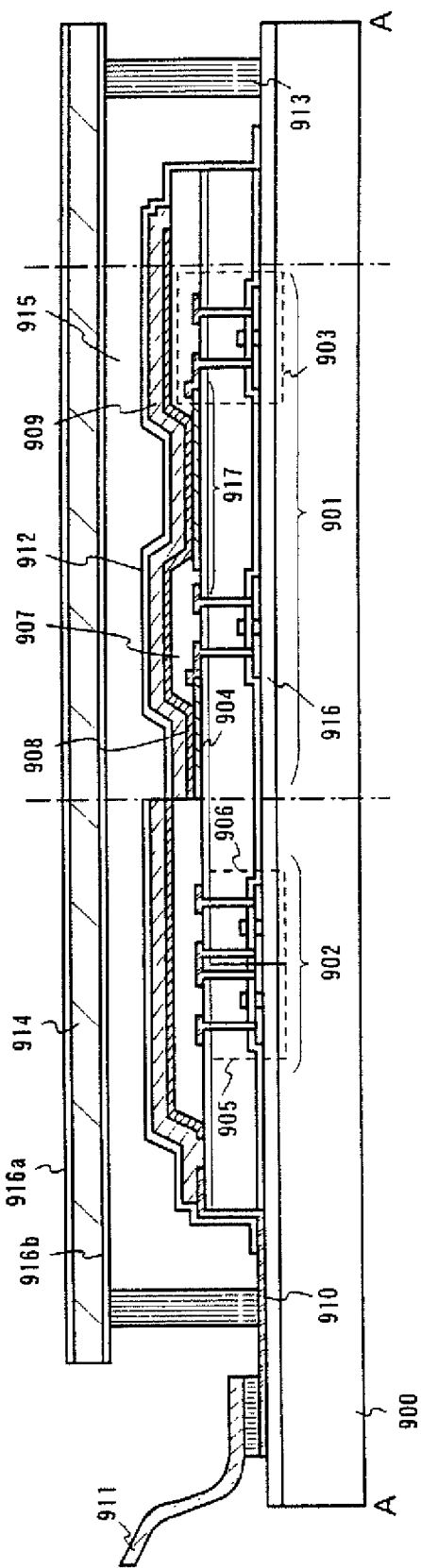
FIGS. 9A to 9C are diagrams showing cross sectional structures of a light emitting device.

FIG. 9A is a cross sectional view which shows a state after processing up to the sealing of the EL element. A pixel portion 901 and a driver circuit 902 are formed upon a glass substrate 900. The pixel portion 901 is formed using a plurality of pixels each including a current control TFT 903 and a pixel electrode 904 electrically connected to the drain thereof. Also, the driver circuit 902 is formed using a CMOS circuit in which an n-channel transistor 905 and a p-channel transistor 906 are combined with each other. Note that a compound containing silicon such as silicon nitride, silicon oxide, or silicon oxynitride, or a carbon film (specifically, a diamond like carbon film) 916 is preferably provided as a protective film with a thickness of 2 to 30 nm on the glass substrate 900. Thus, entrance of the impurity from the substrate side can be prevented.

The pixel electrode 904 functions as the anode of the EL element. A bank 907 is formed at both ends of the pixel electrode 904. An EL layer 908 and a cathode 909 of the EL element are formed on the pixel electrode 904. The cathode 909 functions also as a common wiring to all pixels and is electrically connected with an FPC (flexible printed circuit) 911 through a connection wiring 910. Note that, although only the FPC is shown here, a printed wiring board (PWB) may be attached to the FPC. All elements included in the pixel portion 901 and the driver circuit 902 are covered with a passivation film 912.

Note that, processing which is performed in a portion 917 in order to prevent the impurity such as oxygen or water from entering the EL element will be described using FIGS. 9B and 9C.

Figure 9C:
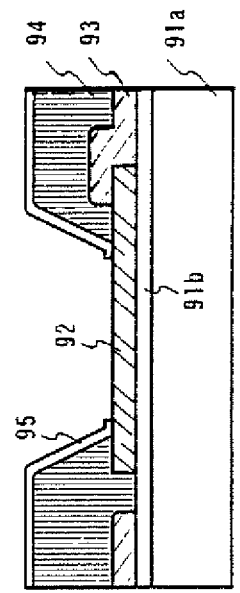
Figure 9B:
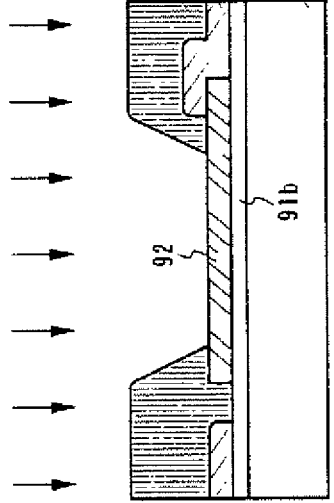

In FIG. 9B, reference numerals 91a and 91b denote interlayer insulating films. The film 91a is formed using an organic resin film of polyimide or polyamide, and an insulating film such as a silicon nitride film, a silicon oxide film, or a DLC film is formed thereon. Then, a pixel electrode 92 and a connection wiring 93 led from the current control TFT are formed, and a bank 94 is further formed to fill a gap between the pixel electrodes.

At this time, the bank 94 is formed using an organic resin film of polyimide or polyamide. Thus, in this embodiment, the surface of the bank 94 is plasma-processed in a noble gas such as Ar to thereby make it densified. Thus, the impurity included in the surface of the bank can be removed and entrance of the impurity from the outside can be prevented.

FIG. 9C shows the same structure as that of FIG. 9B up to the formation of the bank 94. However, a passivation film 95 such as a silicon nitride film, a silicon oxide film, or a DLC film is formed with a thickness of 2 to 30 nm on the bank 94. Note that, in this case, the bank 94 is completely sealed with the passivation film 95. Therefore, there is no case where the impurities such as oxygen and water, which are included in the bank 94, are emitted to the outside, and the deterioration of the EL element can be prevented.

Next, as shown in FIG. 9A, a cover member 914 is adhered to the EL element by a seal member 913. Note that a spacer for securing a constant interval between the cover member 914 and the EL element may be provided. A gap 915 is formed inside the sealing member 913. Note that the sealing member 913 is desirably a material which does not transmit moisture and oxygen. Further, it is effective that a substance with a moisture absorption effect or a substance with an anti-oxidizing effect is provided inside the gap 915.

Note that carbon films (specifically, diamond like carbon films) 916a and 916b are preferably provided as protective films with a thickness of 2 to 30 nm on both surfaces of the cover member 914. Such carbon films have a function for preventing the entrance of oxygen and water and also a function mechanically protecting the surface of the cover member 914.

When the EL element is sealed based on the above structure, the EL element can be completely isolated from the outside, and thus the entrance of a substance such as moisture or oxygen from the outside, which promotes the deterioration of the EL layer due to oxidation, can be prevented. Therefore, a light emitting device with high reliability is obtained. Note that the structure of this embodiment can be embodied by freely combining any structure described in Embodiments 1 to 3.

[Embodiment 5]

In this embodiment, a metal mask used at film formation, in order to realize colorization of an EL layer using the film formation apparatus of the present invention, will be described with reference to FIGS. 10A to 10D.

Figure 10A:
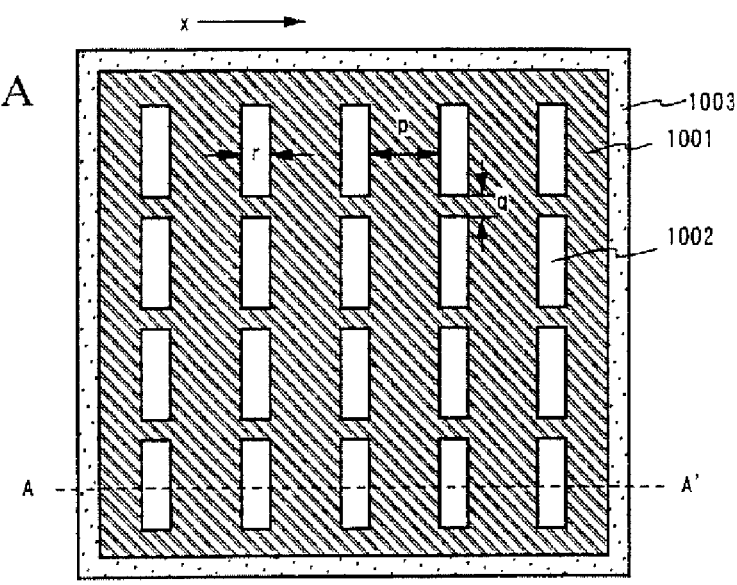
FIGS. 10A to 10D are diagrams for explaining a metal mask.

FIG. 10A is a top view of a metal mask. Reference numeral 1001 denotes a mask portion for the metal mask, which has a function of covering a portion on which a film is not formed.

Also, reference numeral 1002 denotes an opening "a". In the mask portion 1001, a plurality of openings "a" 1002 are formed. EL materials after passing through the openings "a" 1002 are formed on a substrate at evaporation.

The metal mask shown in FIG. 10A in this embodiment is moved in a direction indicated by an arrow "x" after an EL material with one color is formed, and then an EL material with another color is formed on an adjacent pixel. This operation is repeated to thereby form EL materials with plural colors.

Also, with respect to a shape of the opening "a" 1002 of the metal mask, a distance (p) between adjacent openings "a" in a transverse direction (direction in which a pixel row with different colors is formed) is preferably 10 to 200 µm. Also, a distance (q) between adjacent openings "a" 1002 in a longitudinal direction (direction in which a pixel row with the same color is formed) is preferably 10 to 40 µm. Further, a short side (r) of the opening "a" 1002 is preferably 20 to 200 µm.

Figure 10B:
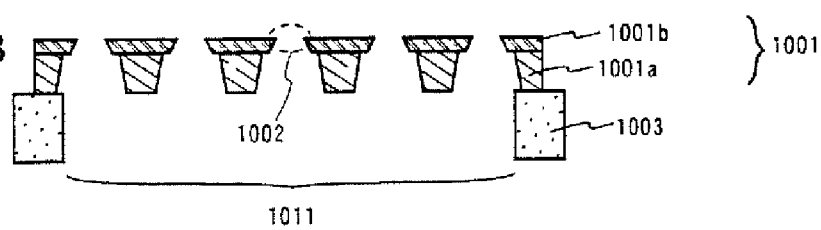

Note that the mask portion 1001 of the metal mask is made from a mask member with a two-layer structure. However, when the mask portion 1001 is adhered to a mask frame 1003 to obtain a three-layer structure, a metal mask with a higher strength can be formed. A cross sectional view obtained by cutting FIG. 10A along a line A-A' is shown in FIG. 10B. Note that as the mask frame 1003 used in this embodiment, a member made of hollow aluminum, alumina or the like can be used. Also, a film thickness is preferably 1 to 15 mm. Further, in the mask frame 1003, an opening "b" 1011 which is slightly smaller than the metal mask (first mask layer 1001a and second mask 1001b) is provided. When the opening "b" 1011 is overlapped with the mask portion 1001 and then a portion thereof is adhered to the mask frame 1003 so as to the mask frame, the metal mask can be completed.

Next, a method of forming the metal mask will be described using FIG. 10C. Note that the metal mask formed in FIG. 10C has a structure which is partially different from that shown in FIG. 10B. However, according to the present invention, either structure of these metal masks can be used.

First, a first mask layer 1101a is formed. Note that the first mask layer 1101a is preferably formed by using a material attracted by a magnet, that is, a metal material such as iron, copper, nickel, cobalt, aluminum, silver, tantalum, or tungsten, an alloy of these metals, or stainless (SUS316). Note that a film thickness of the first mask layer 1101a formed here is preferably 50 to 200 µm.

Next, a second mask layer 1101b is laminated on the first mask layer 1101a. At this time, the second mask layer 1101b is preferably formed by using a known film formation method such as an evaporation method, a sputtering method, or a CVD method. Note that a film thickness of the second mask layer 1101b formed here is preferably 0.5 to 20 µm. Also, it is required that the second mask layer 1101b is formed using a material with a sufficiently high etching selection ratio in the case where it is simultaneously etched using the same etching solution as that for the first mask layer 1101a.

Note that a film thickness ratio of the second mask layer 1101b to the first mask layer 1101a is preferably 0.1 to 0.01. Also, when the same etching solution is used, a ratio of an etching rate of a material of the second mask layer 1101b to that of the first mask layer 1101a is preferably 0.001 or less in the case where a film thickness ratio between both layers is 0.01 or less.

Figure 10C:
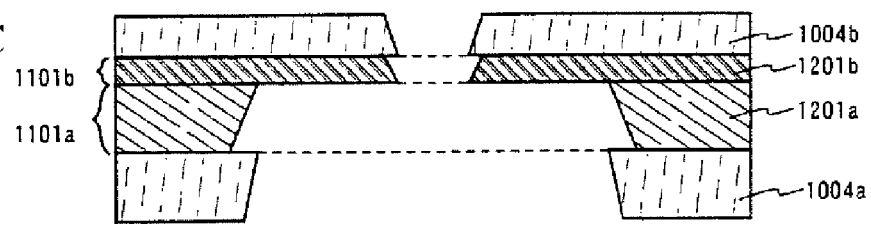

Thus, when the metal mask, in which the first mask layer 1101a and the second mask layer 1101b are laminated, is etched at once after both surfaces thereof are covered with resist materials (1004a and 1004b), the metal mask with a shape as indicated by reference numerals 1201a and 1201b in FIG. 10C can be formed. Note that although the case where the metal mask is formed using two kinds of materials is described here, the metal mask can be formed by etching using one kind of material.

After the metal mask (1201*a* and 1201*b*) is formed, the resists (1004*a* and 1004*b*) are removed and then the metal mask is adhered to the mask frame 1003. Thus, the metal mask with a higher strength can be formed. Also, when the mask frame 1003 is used, the metal mask with a large format size such as 400×500 mm or 620×720 mm can be formed.

Figure 10D:
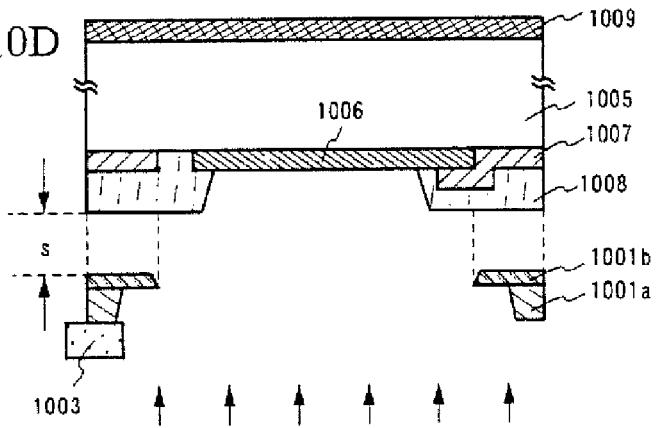

Next, a method of performing film formation using the metal mask formed as shown in FIG. 10C on a substrate which has a TFT (not shown) in which a pixel electrode 1006, a wiring 1007, and a bank 1008 are formed will be described using FIG. 10D, which is a part of a cross sectional view. At this time, when a magnet 1009 is provided at the opposite side to the metal mask of the substrate, the first mask layer 1011*a* is attracted by the magnetic force. Thus, a distance (s) between the substrate and the metal mask is shortened (s≧0) and a degree of contact between the substrate and the metal mask can be further improved. Therefore, an improper pattern produced by distortion, floating, shift, or the like of the metal mask can be prevented and film formation using the EL material can be performed with high precision.

Note that the structure of this embodiment can be embodied by freely combining any structure of Embodiments 1 to 4.

When the film formation apparatus of the present invention is used, thin film formation using a further sublimated and purified material is realized. Also, since a function for preventing impurity contamination is provided in the inner portion of the film formation apparatus, film formation can be performed without being affected by the contamination due to the impurity at film formation. Therefore, an element characteristic of the EL element can be further improved as compared to that of so far.

What is claimed is:

1. A method for manufacturing a light emitting device comprising:
   evaporating a first solid including an EL material in a first system;
   separating the first solid into a second solid deposited on a side wall of a second system and a first gas removed from an opening of the second system, the first gas being an impurity;
   evaporating the second solid in the second system;
   separating the second solid into a third solid deposited on a side wall of a third system and a second gas, the third solid being an impurity; and
   forming a film over a substrate using the second gas.

2. A method for manufacturing a light emitting device according to claim 1, wherein the second system is located over the first system and the third system is located over the second system.

3. A method for manufacturing a light emitting device according to claim 1, wherein the film is formed in contact with a pixel electrode which is electrically connected with a thin film transistor.

4. A method for manufacturing a light emitting device comprising:
   evaporating a first solid including an EL material in a first system, wherein the first system is controlled to a first temperature;
   separating the first solid into a second solid deposited on a side wall of a second system and a first gas removed from an opening of the second system, the first gas being an impurity,. and wherein the second system is controlled to a second temperature lower than the first temperature;
   evaporating the second solid in the second system, wherein the second system is controlled to the first temperature;
   separating the second solid into a third solid deposited on a side wall of a third system and a second gas, the third solid being an impurity, and wherein the third system is controlled to a third temperature lower than the first temperature and higher than the second temperature; and
   forming a film over a substrate using the second gas.

5. A method for manufacturing a light emitting device according to claim 4, wherein the second system is located over the first system and the third system is located over the second system.

6. A method for manufacturing a light emitting device according to claim 4, wherein the film is formed in contact with a pixel electrode which is electrically connected with a thin film transistor.

7. A method for manufacturing a light emitting device comprising:
   evaporating a first solid including an EL material in a first system;
   separating the first solid into a second solid deposited on a side wall of a second system and a first gas removed from an opening of the second system, the first gas being an impurity;
   inverting the second system upside down;
   evaporating the second solid in the second system;
   separating the second solid into a third solid deposited on a side wall of a third system and a second gas, the third solid being an impurity; and
   forming a film over a substrate using the second gas.

8. A method for manufacturing a light emitting device according to claim 7, wherein the second system is located over the first system and the third system is located over the second system.

9. A method for manufacturing a light emitting device according to claim 7, wherein the film is formed in contact with a pixel electrode which is electrically connected with a thin film transistor.

10. A method for manufacturing a light emitting device comprising:
    evaporating a first solid including an EL material in a first system, wherein the first system is controlled to a first temperature;
    separating the first solid into a second solid deposited on a side wall of a second system and a first gas removed from an opening of the second system, the first gas being an impurity, and wherein the second system is controlled to a second temperature lower than the first temperature;
    inverting the second system upside down;
    evaporating the second solid in the second system, wherein the second system is controlled to the first temperature;
    separating the second solid into a third solid deposited on a side wall of a third system and a second gas, the third solid being an impurity, and wherein the third system is controlled to a third temperature lower than the first temperature and higher than the second temperature; and
    forming a film over a substrate using the second gas.

11. A method for manufacturing a light emitting device according to claim 10, wherein the second system is located over the first system and the third system is located over the second system.

12. A method for manufacturing a light emitting device according to claim 10, wherein the film is formed in contact with a pixel electrode which is electrically connected with a thin film transistor.

* * * * *